US012021509B2

(12) United States Patent
Yoon et al.

(10) Patent No.: US 12,021,509 B2
(45) Date of Patent: Jun. 25, 2024

(54) ELECTROACOUSTIC FILTER INCLUDING SPLIT RESONATOR WITH DETUNING

(71) Applicant: RF360 Singapore Pte. Ltd., Republic Plaza (SG)

(72) Inventors: Jiman Yoon, Stadtbergen (DE); Jürgen Kiwitt, Karlsruhe (DE); Robert Koch, Großkarolinenfeld (DE); Maximilian Pitschi, Rottach-Egern (DE); Gerhard Kloska, Rosenheim (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 593 days.

(21) Appl. No.: 17/155,829

(22) Filed: Jan. 22, 2021

(65) Prior Publication Data
US 2022/0239281 A1    Jul. 28, 2022

(51) Int. Cl.
*H03H 9/64*     (2006.01)
*H03H 9/145*    (2006.01)
(Continued)

(52) U.S. Cl.
CPC ...... *H03H 9/6483* (2013.01); *H03H 9/14541* (2013.01); *H03H 9/25* (2013.01); *H03H 9/6409* (2013.01); *H04B 1/0057* (2013.01)

(58) Field of Classification Search
CPC .... H03H 9/6483; H03H 9/14541; H03H 9/25; H03H 9/6409; H03H 9/725;
(Continued)

(56) References Cited

U.S. PATENT DOCUMENTS

| 6,259,336 | B1  | 7/2001 | Ichikawa |
| 2010/0148887 | A1* | 6/2010 | Matsuda ............ H03H 9/02992 333/133 |

(Continued)

FOREIGN PATENT DOCUMENTS

WO      2020021029 A2      1/2020

OTHER PUBLICATIONS

International Search Report and Written Opinion—PCT/EP2022/050375—ISA/EPO—Jan. 18, 2023.
(Continued)

*Primary Examiner* — Lincoln D Donovan
*Assistant Examiner* — Tyler J Pereny
(74) *Attorney, Agent, or Firm* — Polsinelli

(57) ABSTRACT

Aspects of the disclosure relate to wireless communication, and high-frequency filters with resonators. One example is a frequency band filter circuit having a split resonator. The split resonator comprises a resonator including a first section of a shared input busbar, a first section of a shared output busbar, and an electrode structure between the first section of the shared input busbar and the first section of the shared output busbar, the electrode structure configured for a resonance. The split resonator also comprises a detuned resonator. The detuned resonator includes a second section of the shared input busbar, a second section of the shared output busbar, and a detuned electrode structure between the second section of the shared input busbar and the second section of the shared output busbar, the detuned electrode structure configured for a detuned resonance different from the resonance.

29 Claims, 17 Drawing Sheets

(51) Int. Cl.
*H03H 9/25* (2006.01)
*H04B 1/00* (2006.01)

(58) Field of Classification Search
CPC ............ H03H 9/14597; H03H 9/6426; H03H 9/6436; H03H 9/6456; H03H 9/6459; H03H 9/6476; H03H 9/14591; H03H 9/02559; H03H 9/02574; H03H 9/02637; H03H 9/14547; H03H 9/14555; H04B 1/0057
See application file for complete search history.

(56) References Cited

U.S. PATENT DOCUMENTS

| | | | |
|---|---|---|---|
| 2010/0259341 A1 | 10/2010 | Nakai | |
| 2013/0063228 A1* | 3/2013 | Hampel | H01P 1/20327 333/205 |
| 2016/0380614 A1 | 12/2016 | Abbott et al. | |
| 2019/0036554 A1 | 1/2019 | Ito et al. | |
| 2019/0123717 A1* | 4/2019 | Gavryliuk | H03H 9/545 |
| 2019/0199321 A1* | 6/2019 | Nosaka | H03H 9/6483 |
| 2020/0021271 A1 | 1/2020 | Plesski | |
| 2022/0149817 A1* | 5/2022 | Schmidhammer | H03H 9/6409 |

OTHER PUBLICATIONS

Partial International Search Report—PCT/EP2022/050375—ISA/EPO—Sep. 26, 2022.

\* cited by examiner

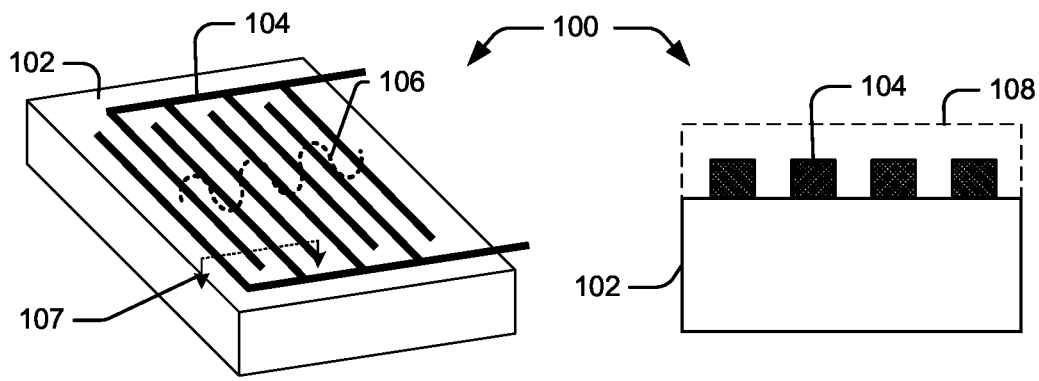
FIG. 1A
FIG. 1B
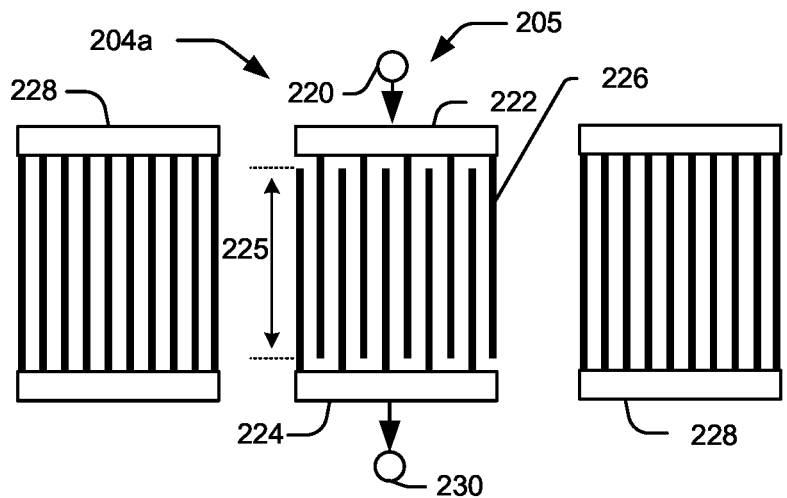
FIG. 2A
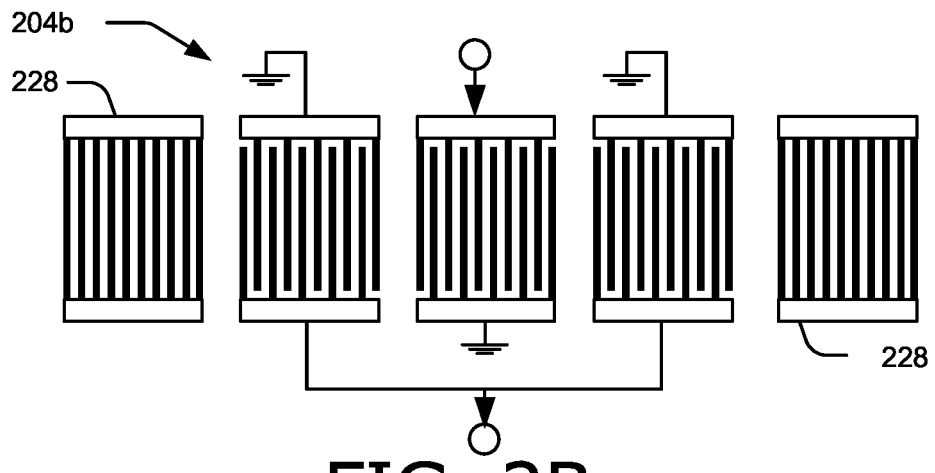
FIG. 2B

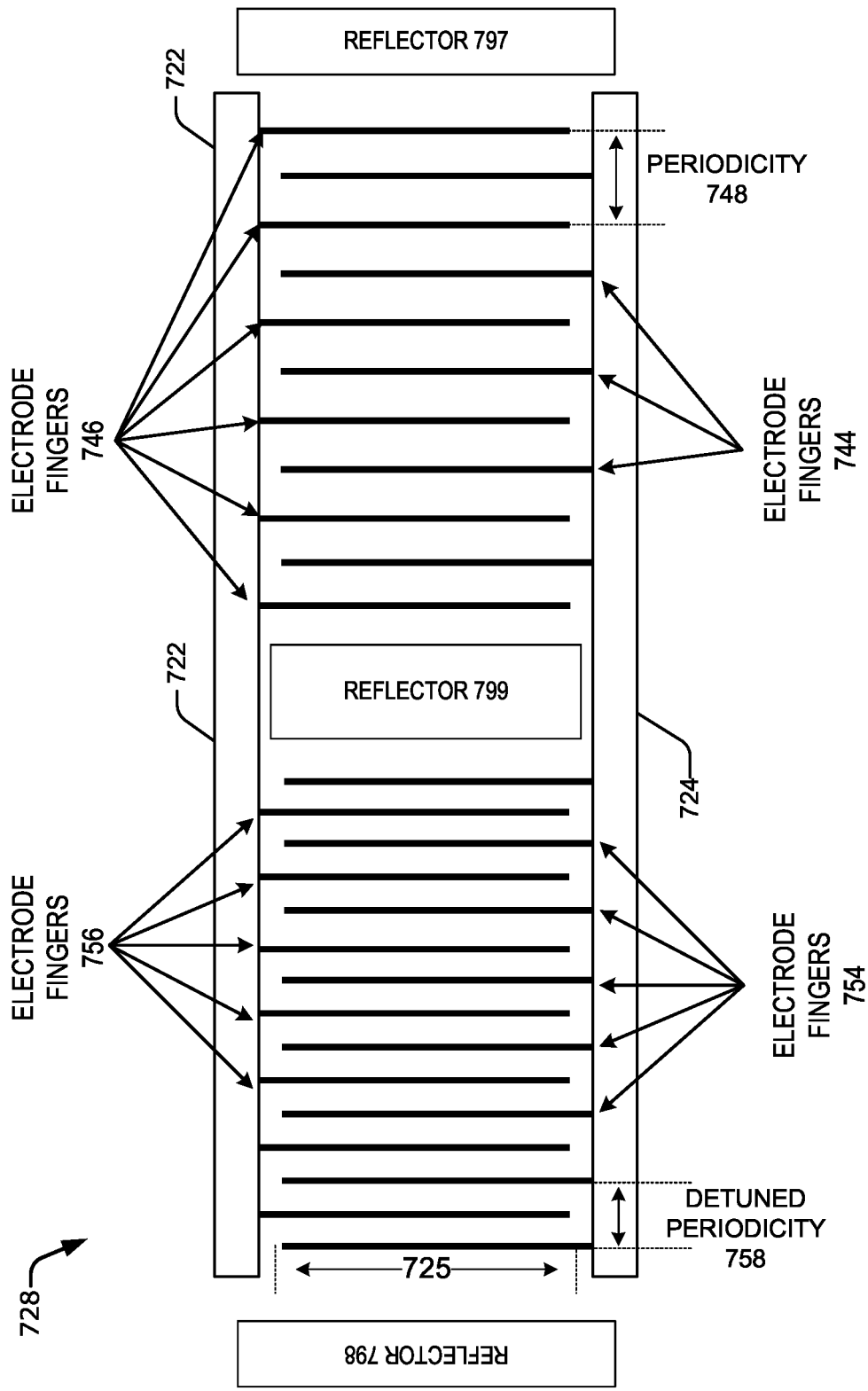

ELECTROACOUSTIC FILTER INCLUDING SPLIT RESONATOR WITH DETUNING

FIELD

The present disclosure relates generally to wireless communications, and in particular to high-frequency filters that can be implemented with electroacoustic resonators. Use of a split resonator with detuning in an electroacoustic filter is described to reduce performance degradation from in band resonance.

BACKGROUND

Electronic devices include traditional computing devices such as desktop computers, notebook computers, tablet computers, smartphones, wearable devices like a smartwatch, interne servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

SUMMARY

Aspects of the present disclosure describe elements of filter circuits for wireless communication systems. As described above, electroacoustic resonators can be used in such filter circuits. In some configurations, a "long" resonator can contribute to in-band resonance problems that interfere with passband or stopband performance. Examples described herein include split resonators in place of long resonators, with a detuned resonance in part of the split resonator. Filters including split resonators as described herein have improved device performance with flatter passband characteristics for improved communication performance such as reduced error rates for communications in the band associated with the filter. Aspects of the present disclosure use split resonators within RF filters to improve filter characteristics and associated communication performance characteristics of devices that use such split resonators.

In one illustrative example, a wireless communication apparatus is provided. The wireless communication apparatus comprises a frequency band filter circuit having a split resonator, the split resonator comprising: a resonator including a first section of a shared input busbar, a first section of a shared output busbar, and an electrode structure between the first section of the shared input busbar and the first section of the shared output busbar, the electrode structure configured for a resonance; and a detuned resonator including a second section of the shared input busbar, a second section of the shared output busbar, and a detuned electrode structure between the second section of the shared input busbar and the second section of the shared output busbar, the detuned electrode structure configured for a detuned resonance different from the resonance.

Some aspects operate where the detuned resonator is positioned further than the resonator from a current input and a current output for the split resonator.

Some aspects operate where the electrode structure includes first fingers set at a first pitch selected for the resonance; and where the detuned electrode structure includes second fingers set at a second pitch selected for the detuned resonance, wherein the first pitch is different from the second pitch.

Some aspects operate where the split resonator is configured for anti-parallel current flow, with a current through the shared input busbar flowing in an opposite direction from a current through the shared output busbar.

Some aspects further comprise a pad electrically coupled to the split resonator, wherein the detuned resonance is selected to compensate for an inductance from the pad.

Some aspects operate where the detuned resonance is determined as a function of a resonance angular frequency, an anti-resonance angular frequency, and a is within a threshold value associated with a largest allowable deviation by the detuned resonance from the resonance.

Some aspects operate where the detuned resonance is within 20 MHz of the resonance.

Some aspects operate where the detuned resonance is within one percent of a center frequency of the frequency band filter circuit.

Some aspects operate where the detuned resonance is within ten percent of a passband width of a filter passband of the frequency band filter circuit.

Some aspects operate where the detuned resonance is within ten percent of a stopband width of a filter stopband of the frequency band filter circuit.

Some aspects operate where the frequency band filter circuit comprises a plurality of resonators in a ladder configuration, wherein the plurality of resonators comprises the split resonator.

Some aspects operate where the split resonator is configured as a parallel resonator within the ladder configuration.

Some aspects operate where the plurality of resonators are micro-acoustic.

Some aspects operate where a filter passband of the frequency band filter circuit has an upper frequency less than or equal to 6 gigahertz (GHz).

Some aspects further comprise an output port electrically coupled to the shared output busbar; and an input port electrically coupled to the shared input busbar.

Some aspects further comprise a filter circuit including the split resonator; an antenna coupled to the output port via first one or more elements of the filter circuit; and processing circuitry coupled to the input port via second one or more elements of the filter circuit.

Some aspects operate where the wireless communication apparatus comprises a mobile communication device including a transceiver circuit, wherein the transceiver circuit includes the frequency band filter circuit.

Some aspects further comprise a plurality of frequency band filter circuits comprising the frequency band filter circuit for a first band, a frequency band filter circuit for a second band, and a frequency band filter circuit for a third band.

Some aspects operate where the split resonator further comprises a piezo material, wherein with the electrode structure and the detuned electrode structure are positioned on the piezo material.

Some aspects operate where the resonator further includes a first reflector positioned at a side of the resonator away from the detuned resonator, and a first central reflector positioned at a side of the resonator adjacent to the detuned resonator; and where the detuned resonator further includes a second reflector positioned at a side of the detuned resonator away from the resonator, and a second central reflector positioned adjacent to the first central reflector of the resonator.

Some aspects further include one or more additional resonators positioned between the resonator and the detuned resonator, the one or more additional resonators including one or more central portions of the shared input busbar and one or more central portions of the shared output busbar.

Some aspects further include a first reflector positioned at an input end of the resonator, and a second reflector at an end of the detuned resonator wherein the wireless communication apparatus does not include a reflector positioned between any of the resonator, the detuned resonator, or the one or more additional resonators.

Another illustrative example is a wireless communication apparatus. The wireless communication apparatus comprises a frequency band filter circuit having a resonator, the resonator comprising: a piezoelectric material; a shared input busbar; a shared output busbar; a first resonator section including: a first input comb shaped electrode structure with a first plurality of electrode fingers coupled to the shared input busbar and extending from the shared input busbar toward the shared output busbar; and a first output comb shaped electrode structure with a first plurality of electrode fingers coupled to the shared output busbar and extending from the shared output busbar toward the shared input busbar, wherein the first input comb shaped electrode structure and the first output comb shaped electrode structure are arranged with electrode fingers positioned in an interdigitated manner and having a first periodicity; and a second resonator section positioned separately from the first resonator section along the shared input busbar and the shared output busbar, the second resonator section comprising: a second input comb shaped electrode structure with a second plurality of electrode fingers coupled to the shared input busbar and extending from the shared input busbar toward the shared output busbar; and a second output comb shaped electrode structure with a second plurality of electrode fingers coupled to the shared output busbar and extending from the shared output busbar toward the shared input busbar, the second input comb shaped electrode structure and the second output comb shaped electrode structure arranged with electrode fingers positioned in an interdigitated manner having a second periodicity different from the first periodicity.

Some aspects further include a pad coupled to the frequency band filter circuit, wherein a pitch of the second plurality of electrode fingers coupled to the shared input busbar and the second plurality of electrode fingers coupled to the shared output busbar of the second resonator section is selected to compensate for an inductance of the pad.

Some aspects operate where the first periodicity is associated with a first resonance, and wherein the second periodicity is associated with a second resonance offset from the first resonance by a detuning amount.

Some aspects operate where the detuning amount is a frequency values less than 20 megahertz (MHz), such that the first resonance is within 20 MHz of the second resonance.

Some aspects operate where the resonator further comprises one or more central reflectors positioned between the first resonator section and the second resonator section.

In another illustrative example, a method of filtering a signal in a wireless communication apparatus is provided. The method comprises: receiving the signal at a frequency band filter circuit having an associated filter passband and a split resonator, the split resonator comprising a resonator and a detuned resonator, wherein the resonator comprises a first section of a shared input busbar, a first section of a shared output busbar, and an electrode structure between the first section of the shared input busbar and the first section of the shared output busbar, wherein the resonator is configured for a resonance, and wherein the detuned resonator comprises a second section of the shared input busbar, a second section of the shared output busbar, and a detuned electrode structure between the second section of the shared input busbar and the second section of the shared output busbar, the detuned electrode structure configured for a detuned resonance different from the resonance; and filtering the signal using the frequency band filter circuit, wherein filtering is configured using a detuned resonance of the detuned resonator to offset an inductance from a pad electrically coupled to the split resonator.

In some aspects, the signal is received from an antenna via a multiplexer coupled to the frequency band filter circuit.

In another illustrative example, a non-transitory machine readable medium is provided with instructions that, when executed by processing circuitry of a device, causes the device to perform operations comprising receiving the signal at a frequency band filter circuit having an associated filter passband and a split resonator, the split resonator comprising a resonator and a detuned resonator, wherein the resonator comprises a first section of a shared input busbar, a first section of a shared output busbar, and an electrode structure between the first section of the shared input busbar and the first section of the shared output busbar, wherein the resonator is configured for a resonance, and wherein the detuned resonator comprises a second section of the shared input busbar, a second section of the shared output busbar, and a detuned electrode structure between the second section of the shared input busbar and the second section of the shared output busbar, the detuned electrode structure configured for a detuned resonance different from the resonance; and filtering the signal using the frequency band filter circuit, wherein filtering is configured using a detuned resonance of the detuned resonator to offset an inductance from a pad electrically coupled to the split resonator.

In another illustrative example, a wireless communication apparatus is provided. The wireless communication apparatus comprises a frequency band filter circuit having a split resonator, the split resonator comprising means for generating a resonance using a shared busbar; and means for generating a detuned resonance using the shared busbar.

In some aspects, the apparatuses described above can include a mobile device with a camera for capturing one or more pictures. In some aspects, the apparatuses described above can include a display for displaying one or more pictures. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

FIG. 1A is a diagram of a perspective view of an example of an electroacoustic device.

FIG. 1B is a diagram of a side view of the electroacoustic device of FIG. 1A.

FIG. 2A is a diagram of a top view of an example of an electrode structure of an electroacoustic device.

FIG. 2B is a diagram of a top view of another example of an electrode structure of an electroacoustic device.

FIG. 7E is a representation of a split resonator with a central reflector in accordance with aspects of examples described herein.

DETAILED DESCRIPTION

Figure 3A:
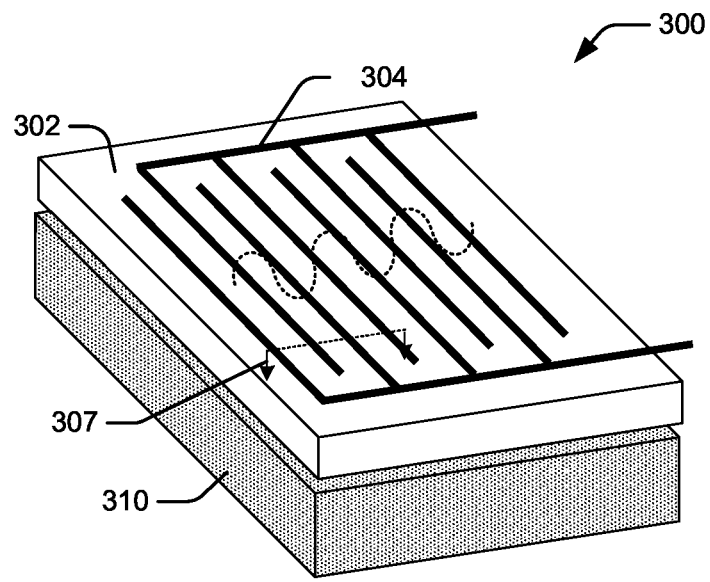
FIG. 3A is a diagram of a perspective view of another example of an electroacoustic device.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Electroacoustic devices such as surface acoustic wave (SAW) resonators, which employ electrode structures on a surface of a piezoelectric material, are being designed to cover more frequency ranges (e.g., 500 MHz to 6 GHz), to have higher bandwidths (e.g., up to 25%), and to have improved efficiency and performance. In general, certain SAW resonators are designed to cause propagation of an acoustic wave in a particular direction through the piezoelectric material (e.g., main acoustic wave mode). However, due to the nature of the particular piezoelectric material used and the way the piezoelectric material is excited by the electrode structure, at least some undesired acoustic wave modes in other directions may be generated. By adjusting characteristics of the electrode structure, acoustic velocities in various transversal regions may be controlled in a manner to reduce transversal acoustic wave modes. The characteristics that are adjusted may depend on the type of piezoelectric material and other characteristics of the SAW resonator.

In addition to the SAW devices described herein, other resonators can be used in RF filters in accordance with the examples described herein. For example, bulk acoustic wave (BAW) or think-film bulk acoustic resonator (FBAR or TFBAR) devices include a piezoelectric material manufactured with thin films sandwiched between two electrodes and isolated from vibrations in a surrounding substrate. All such devices can be referred to as micro-acoustic or microelectroacoustic devices. The piezoelectric films of such devices can have thicknesses in the range of several micrometers down to fractions of a micrometer, and can resonate in frequency ranges above 100 Megahertz (MHz). As described herein, SAW, BAW, and other devices can be referred to as resonators or electroacoustic resonators.

Under certain configurations, a resonator can interact with elements of a design (e.g., self-inductances in connection pads, parasitics, or other such elements) to cause resonance spikes that can interfere with filter operations. In particular, longer resonators configured for anti-parallel current flow (e.g., where current flows along one line, crosses a track, and then flows in an opposite direction along a parallel path) can encounter a problem with a resonant spike within a passband due to the inductance of the U-shaped curve and the anti-parallel current flow interacting with the resonance value of a micro-acoustic device (e.g., a resonator).

Aspects of the present disclosure describe split resonators that are used to replace a single longer resonator, such as a long resonator having the configurations described above. Such a split resonator can replace a single resonator with two or more resonators that share busbars and connections to other circuit elements at the tips (e.g., pads) of a U-shaped current path. A resonator of the split resonator is closer to the tips of the U-shaped path, and keeps the resonance (e.g., as set by a pitch of the resonator elements, such as the periodicity of teeth in a comb structure) of the single resonator. A detuned resonator of the split resonator is at the curved side of the U-shaped path, away from the tips of the U-shape that connect to other elements of the circuit (e.g., via connection pads). The detuned resonator has a resonance that is shifted (e.g., via changing a pitch of the resonator elements such as an adjusted periodicity of teeth in a comb structure) to compensate for the inductance associated with the long current path under the U-structure, and to avoid resonance peaks in passband performance for a filter circuit using the split resonator.

Filters including split resonators as described herein have improved device performance with flatter passband characteristics for improved communication performance such as reduced error rates for communications in the band associated with the filter. Aspects of the present disclosure use split resonators within RF filters to improve filter characteristics and associated communication performance characteristics of devices that use such split resonators.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types (e.g., BAW or TFBAR) that may be constructed based on the principles described herein. The electroacoustic device 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars). In various examples, circuits described herein having such structures can include microelectroacoustic filters implemented with micro-electromechanical structure (MEMS) technology. MEMS technology includes miniature physical structures that can have both mechanical (e.g., vibrational or acoustic) component characteristics as well as electrical characteristics. In some examples, the resonators described herein can be built using MEMS fabrication techniques to generate structures with dimensions less than one micrometer.

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobite (LiNbO3), doped variants of these, or other piezoelectric materials. It should be appreciated that more complicated layer stacks including layers of various materials may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

FIG. 2A is a diagram of a top view of an example of an electrode structure 204a of an electroacoustic device 100. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along the busbars, there is an overlap region including a central region where a portion of one finger overlaps with a portion of an adjacent finger as illustrated by the central region 225. The central region 225 including the overlap may be referred to as the aperture, track, or active region where electric fields are produced between fingers 226 to cause an acoustic wave to propagate in the central region 225 of the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. The distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates is a self-resonance (also called a "main-resonance") frequency of the electrode structure 204a. The frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output such as one of the first terminal 220 or the second terminal 230 while the other terminal may function as an input.

A variety of electrode structures are possible. FIG. 2A may generally illustrate a one-port configuration. Other 2-port configurations are also possible. For example, the electrode structure 204a may have an input IDT 205 where each terminal 220 and 230 functions as an input. In such an event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

FIG. 2B is a diagram of a top view of another example of an electrode structure 204b of an electroacoustic device 100. Such a dual-mode SAW (DMS) electrode structure 204b is illustrated that is a structure which may induce multiple resonances. The electrode structure 204b includes multiple IDTs along with reflectors 228 connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

FIG. 3A is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher Q-factor as compared to the electroacoustic device 100 of FIG. 1A. The piezoelectric material 302, for example, may be Lithium tantalate (LiTaO3) or some doped variant. Another example of a piezoelectric material 302 for FIG. 3A may be Lithium niobite (LiNbO3). In general, the substrate 310 may be substantially thicker than the piezoelectric material 302 (e.g., potentially on the order of 50 to 100 times thicker as one example—or more). The substrate 310 may include other layers (or other layers may be included between the substrate 310 and the piezoelectric material 302).

Figure 3B:
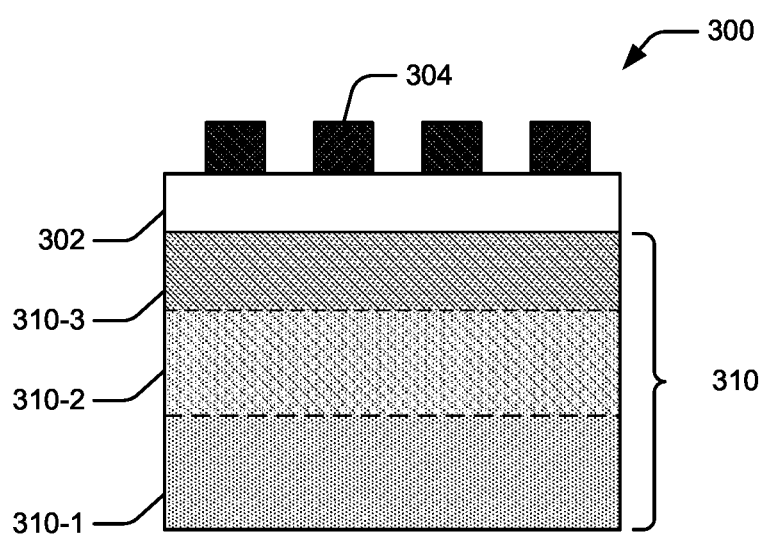
FIG. 3B is a diagram of a side view of the electroacoustic device of FIG. 3A.

FIG. 3B is a diagram of a side view of the electroacoustic device 300 of FIG. 3A showing an exemplary layer stack (along a cross-section 307). In the example shown in FIG. 3B, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer (e.g., silicon dioxide (SiO2) or another dielectric material) that may provide temperature compensation and other properties. These sub-layers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices such as between the electroacoustic device 100 of FIG. 1A and the electroacoustic device 300 of FIGS. 3A and 3B.

Figure 4:
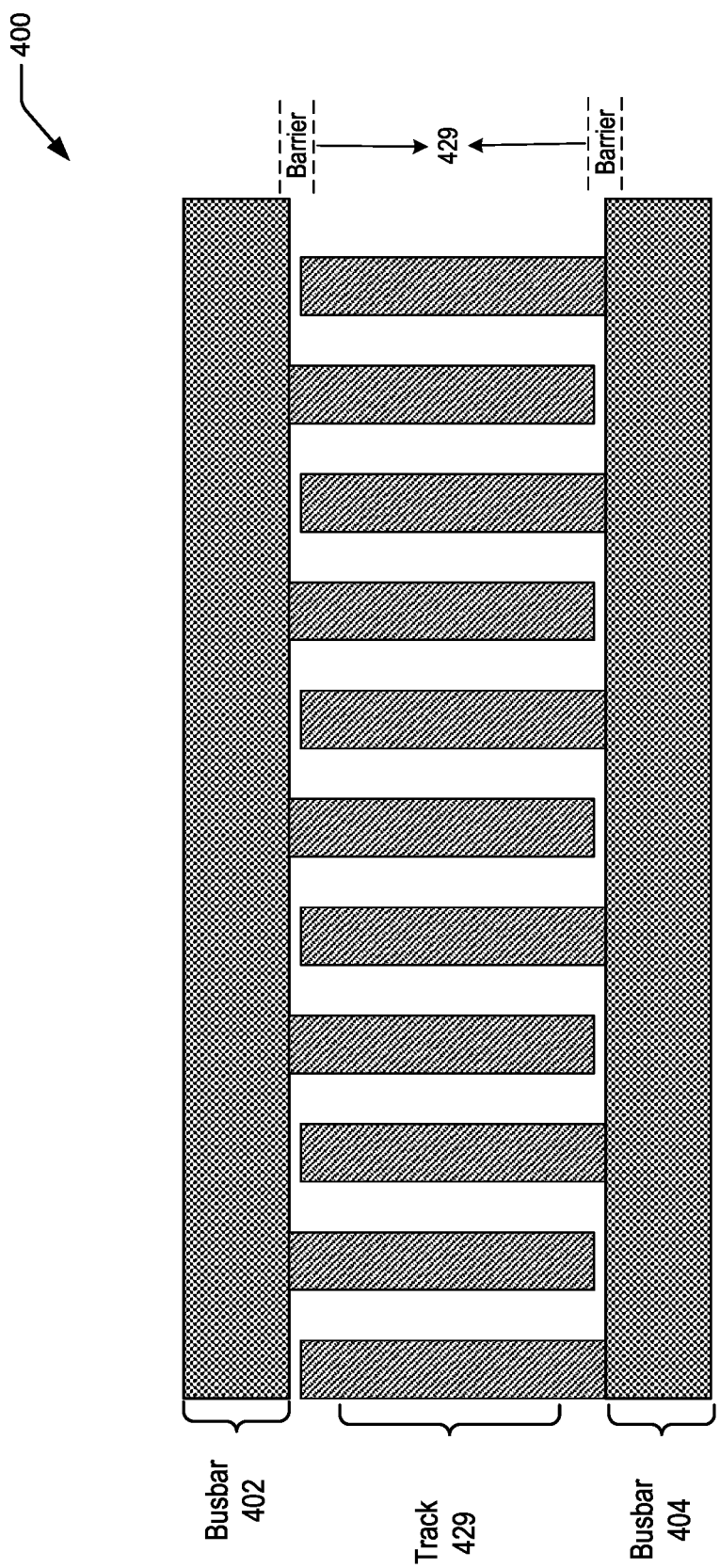
FIG. 4 is a diagram of a view of an electroacoustic device that can be used in accordance with examples described herein.

FIG. 4 is a diagram of a view of an electrode structure 400 a resonator in accordance with some examples. Just as above, the electrode structure 400 may be referred to as an IDT that can be fabricated on the surface of a piezoelectric material as part of a resonator. The electrode structure 400 includes first and second comb shaped electrodes. The comb teeth are within track 429, and supported by busbar 402 on one side and busbar 404 on the other side. An electrical signal excited on one side of the electrode structure is transformed into an acoustic wave that propagates in a particular direction via the piezoelectric material that electrode structure 400 is fabricated on. The acoustic wave is transformed back into an electrical signal and provided as an output.

Figure 5A:
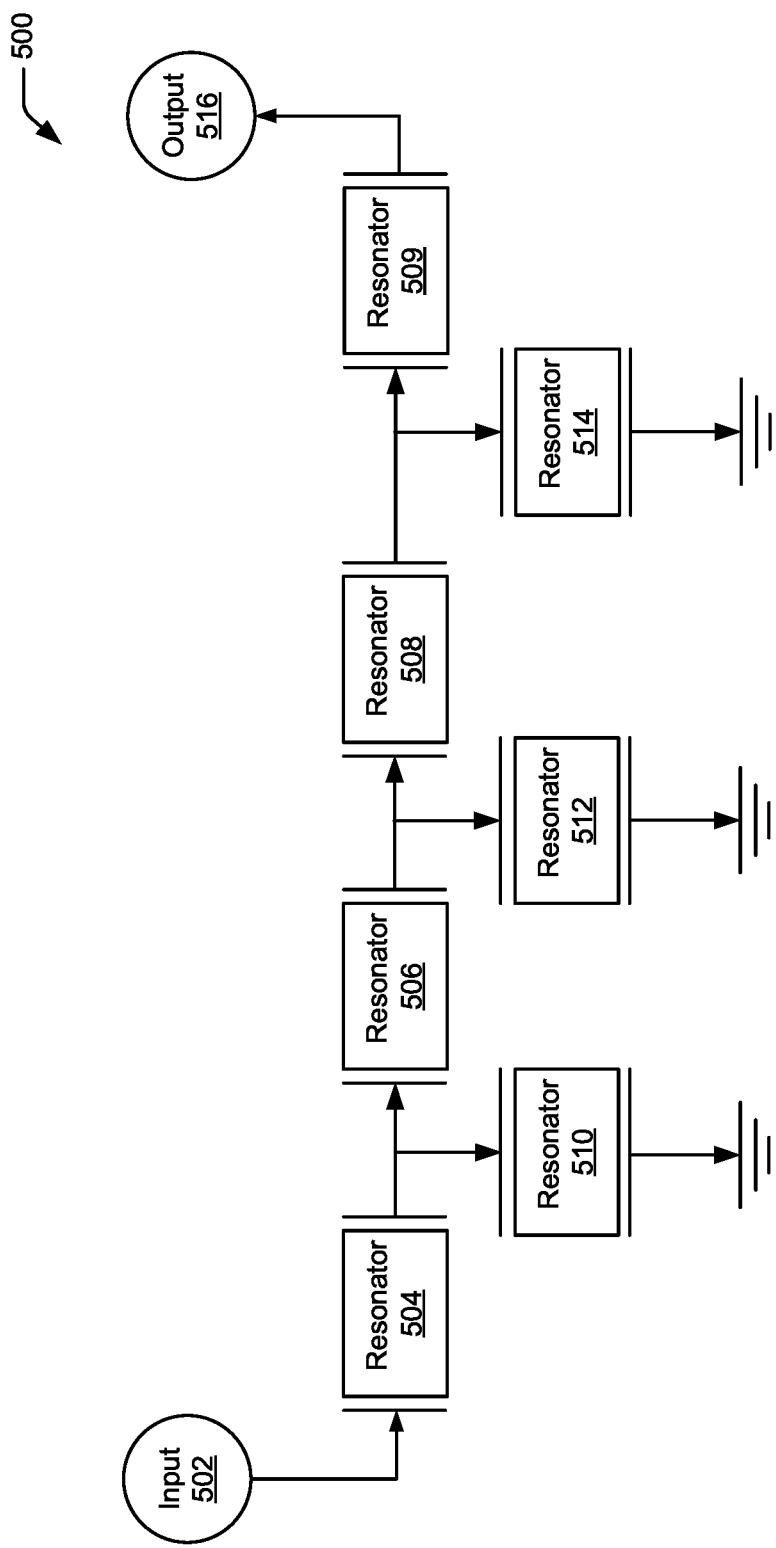
FIG. 5A is a schematic representation of aspects of a filter in accordance with examples described herein.

FIG. 5A is a schematic diagram of an electroacoustic filter circuit 500 that may have a split resonator included in a configuration determined in accordance with the examples described herein. Depending on circuit design elements and resonance spikes, any resonator of filter circuit 500 can be a split resonator as described herein, given the associated design indicators described below (e.g., with respect to FIG. 6A-6E, etc.). The example of FIG. 5A includes a ladder structure. In other examples, other structures can be used (e.g., various DMS configurations or other resonator networks). The filter circuit 500 includes an input 502 and an output 516. Between the input 502 and the output 516 a ladder network of resonators is provided. The resonators can be SAW resonators or any other such resonator device as detailed herein (e.g., BAW etc.). The filter circuit 500 includes a resonator 504, a second resonator 506, a third resonator 508, and a fourth resonator 509 all electrically connected in series between the input 502 and the output 516. A fifth resonator 510 (e.g., a shunt resonator) has a first terminal connected between the resonator 504 and the second resonator 506 and a second terminal connected to a ground potential. A sixth resonator 512 (e.g., shunt resonator) has a first terminal connected between the second resonator 506 and the third resonator 508 and a second terminal connected to a ground potential. Seventh resonator 514 similarly has a first terminal connected between third resonator 508 and fourth resonator 509, and a second terminal connected to a ground potential (e.g., either directly or using additional circuitry, such as an inductor or other connecting circuitry coupled to the ground potential). The electroacoustic filter circuit 500 may, for example, be a band pass circuit having a passband within a selected frequency range (e.g., on the order between 100 MHz and 3.5 GHz).

Figure 5B:
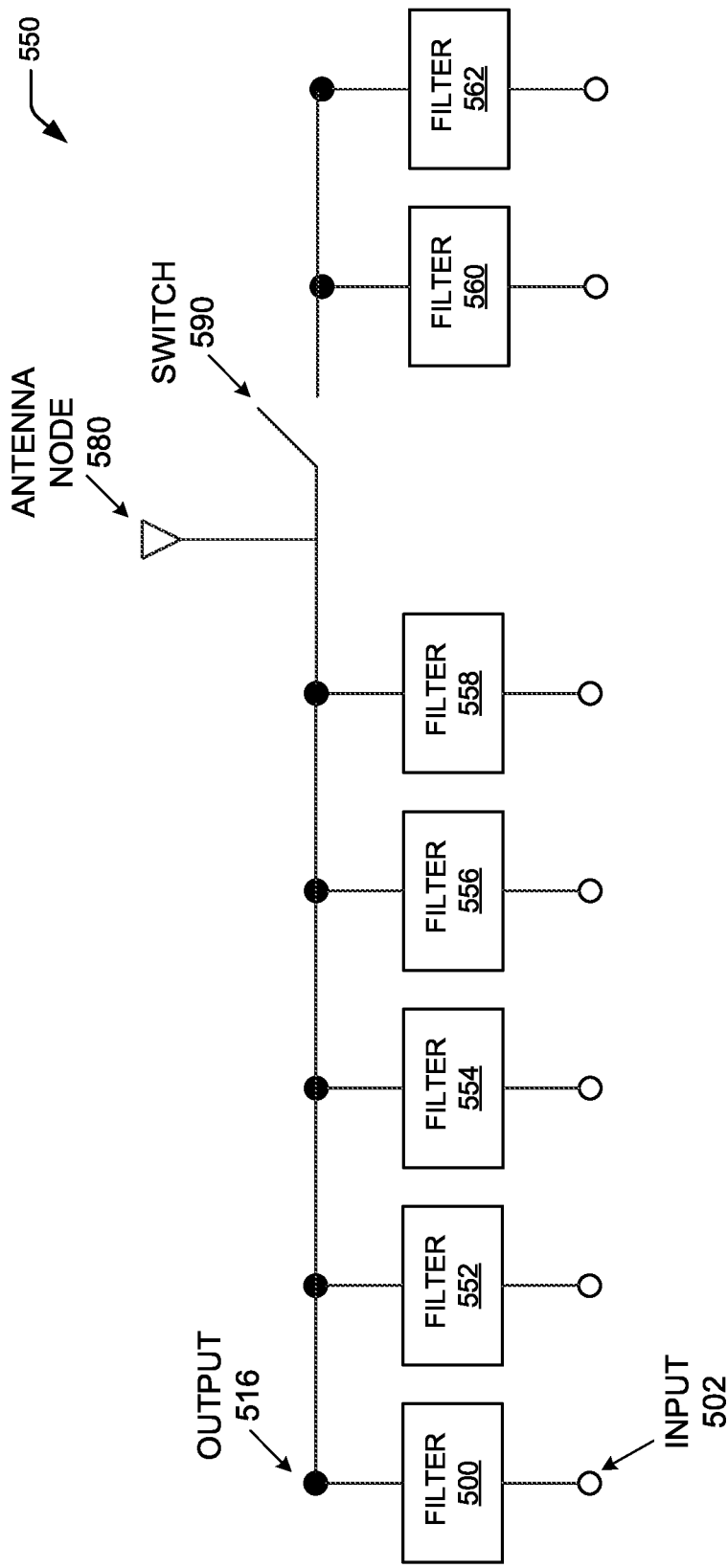
FIG. 5B is a schematic representation of a multiplexer with multiple filters configured for multi-band communications.

FIG. 5B is a schematic representation of a multiplexer circuit 550 with multiple filters configured for multi-band communications using antenna node 580. Just as with FIG. 5A, any filter of FIG. 5B can include a split resonator, depending on the particular design considerations as detailed further below. The filters include filter circuit 500 from FIG. 5A, including output 516 and input 502. Additional filters 552, 554, 556, 558, 560, and 562 are shown, which can be used for corresponding bands of the multi-band communications. Other examples can include multiplexing with any number of filters. Switch 590 can isolate filters 560 and 562 from the remaining filters when the frequency bands associated with filters 560 and 562 are not in use. Isolating filters 560 and 562 can improve the communication performance of multiplexer circuit 550 by limiting interference by filters 560 and 562 with signals from filters (or filter circuits) 500-558 when filters 560 and 562 are not in use (e.g., signal loss due to leakage into filters 560 and 562 is limited when filters 560 and 562 are disconnected by the switch). Other examples may include additional switches to create additional groupings of filters that can be isolated by the switches. Further examples may include no switches, so that all of the filters can be hard-wired at an antenna node as part of the multiplexer circuitry.

In filter, duplexer, or multiplexer designs such as the designs illustrated by FIGS. 5A and 5B above, longer resonators (e.g., resonators with longer electrode structures, such as electrode structure 204 or 400 with relatively long busbars and associated tracks (e.g., spanning the majority of an acoustic die)) are used to achieve high Q values, high power durability for the resonator, efficient layout and area usage, and other performance improvements. Such longer resonators can result in passband spike issues, particularly when a resonator is configured with a narrow connecting pad and sing-side feeding (e.g., anti-parallel current flow). Such passband spikes can also cause problems in stopband or filter skirt regions. Any such spikes can degrade filter performance. Such problems can be more severe at higher frequencies (e.g., electroacoustic filter operation above 1 gigahertz (GHz) or close to 6 GHz) or in filters using with low impedance resonators (e.g., resonators with large static capacitances). Some examples described herein operate with split resonators in filters with passbands having an upper frequency less than or equal to 6 GHz. Other examples can have other such limitations.

Figure 6A:
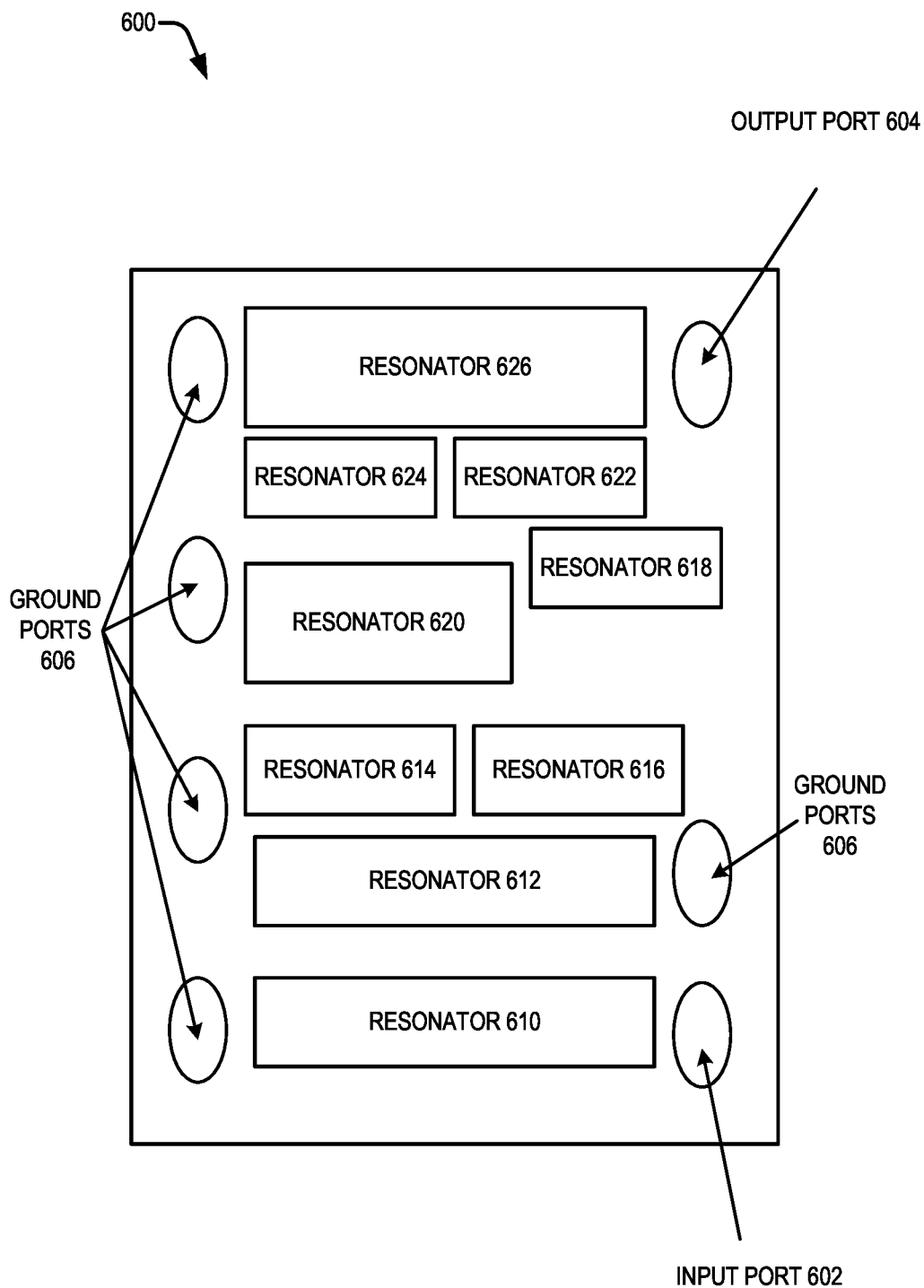
FIG. 6A is a representation of aspects of a frequency band filter circuit in accordance with examples described herein.
Figure 9:
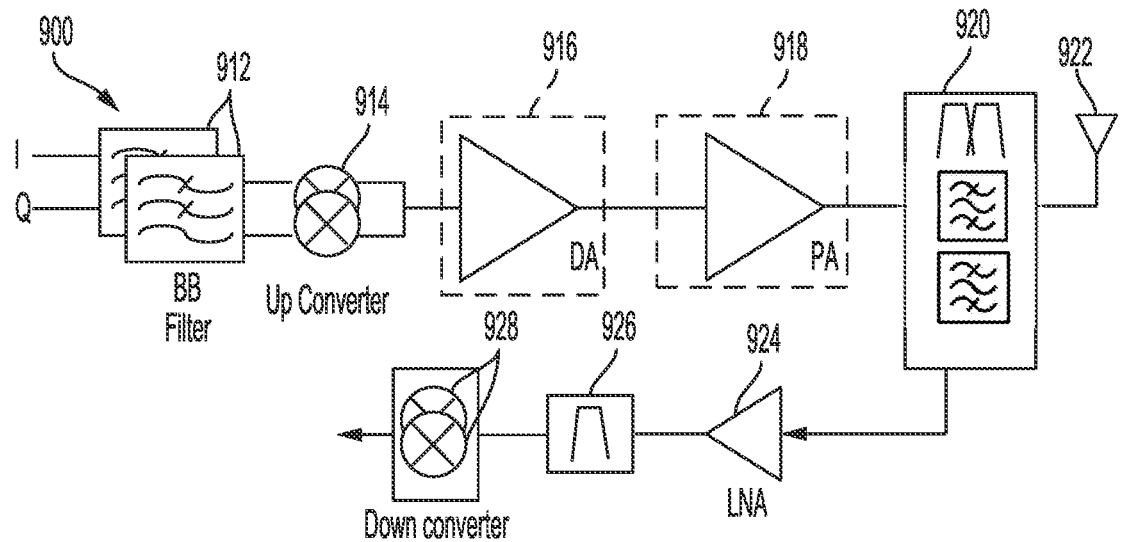
FIG. 9 is a functional block diagram of at least a portion of an example of a simplified wireless transceiver circuit in which the filter circuits and associated split resonators may be employed.
Figure 10:
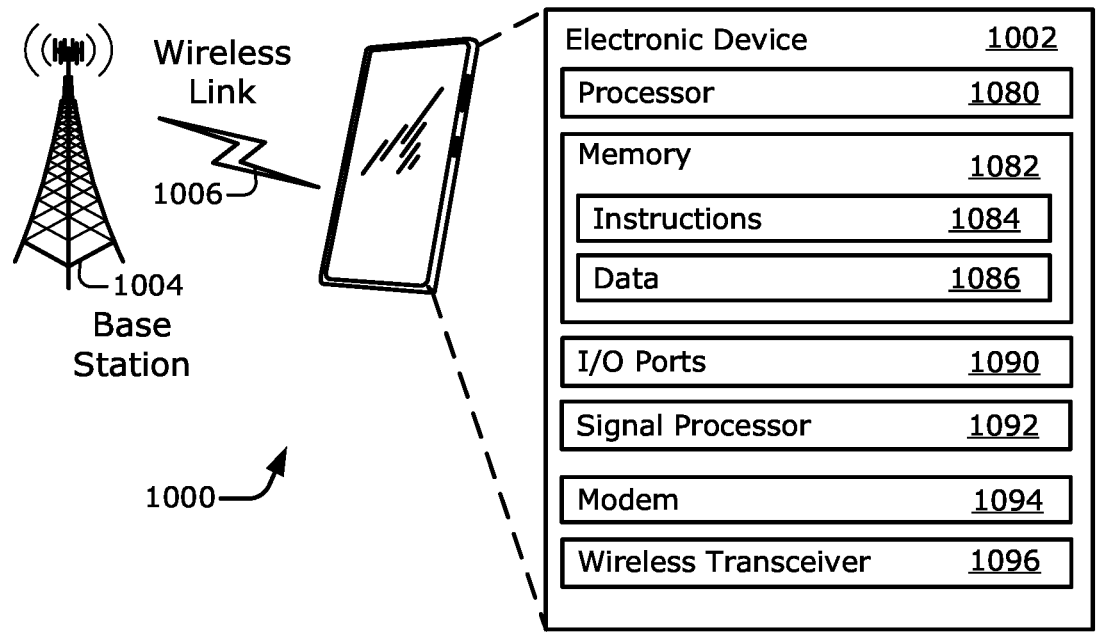
FIG. 10 is a diagram of an environment that includes an electronic device that includes a wireless transceiver such as the transceiver circuit of FIG. 9.

FIG. 6A is a representation of aspects of a frequency band filter circuit in accordance with examples described herein. FIG. 6A shows a wireless communication apparatus 600 with a plurality of ports and a plurality of resonators. The circuit elements connecting the resonators and the ports are not shown. The wireless communication apparatus 600 may, for example, be an integrated circuit implementing a ladder filter such as in the filter circuit 500 of FIG. 5A. FIG. 6A particularly shows resonators 610, 612, 614, 616, 618, 620, 622, 624, and 626, along with ground ports 606, an input port (e.g., signal port) 602, and an output port 604. The output port 604 may, in some examples, be coupled to an antenna directly or via intervening elements, and can be referred to in some implementations as an antenna port. The ground ports 606 are connected to certain resonators for particular filter configurations. The output port 604 may connect to an antenna or be configured for connection to an antenna when the wireless communication apparatus 600 is integrated with a larger device. The input port 602 may connect to processing circuitry of a transceiver or other processing circuitry of an electronic communication apparatus (e.g., as illustrated in FIGS. 9 and 10) to send or receive signals. The input port 602 may be referred to as a signal input, but it will be understood that the input port 602 can also output received signals (e.g., to communication circuitry or processing circuitry of a device). Similarly, the output port 604 may be referred to as an antenna port as described above, but it will be understood that the output port can receive an input signal from an antenna in some configurations.

As described above, spike issues may particularly occur for "long" resonators with a side current feeding configuration (e.g., which results in anti-parallel current flow). In the wireless communication apparatus 600, the resonators 626, 612, and 610 may be considered "long" resonators. Other resonators may be associated with a spike issue due to the other factors considered above as well, such as low resonator impedance, frequency operation, and connection pad dimensions. In various examples, any resonator in a filter described herein can be replaced with a split resonator to improve performance if the resonator is associated with in band resonances that reduce performance in an associated passband filter.

Figure 6B:
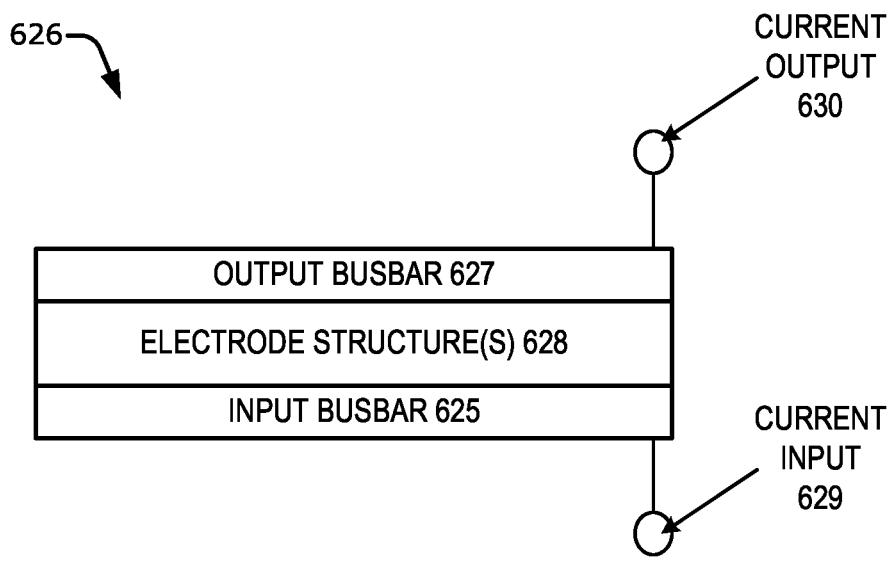
FIG. 6B is a representation of a resonator in accordance with aspects of examples described herein.

FIG. 6B is a representation of the resonator 626 in accordance with aspects of examples described herein. From FIG. 6A, the long resonator 626 is assumed to have a spike issue, which is described in further detailed below. FIG. 6B shows the resonator 626 with input (e.g. signal side) busbar 625 and current input 629, as well as output (e.g., antenna side) busbar 627 and current output 630. Electrode structures 628 may be any suitable electrode structure described herein, such as the comb electrode structures described with respect to FIGS. 1-4 above. The current input 629 and the current output 630 connections are shown in a side feeding configuration, with both connections to one side of the resonator 626.

Figure 6C:
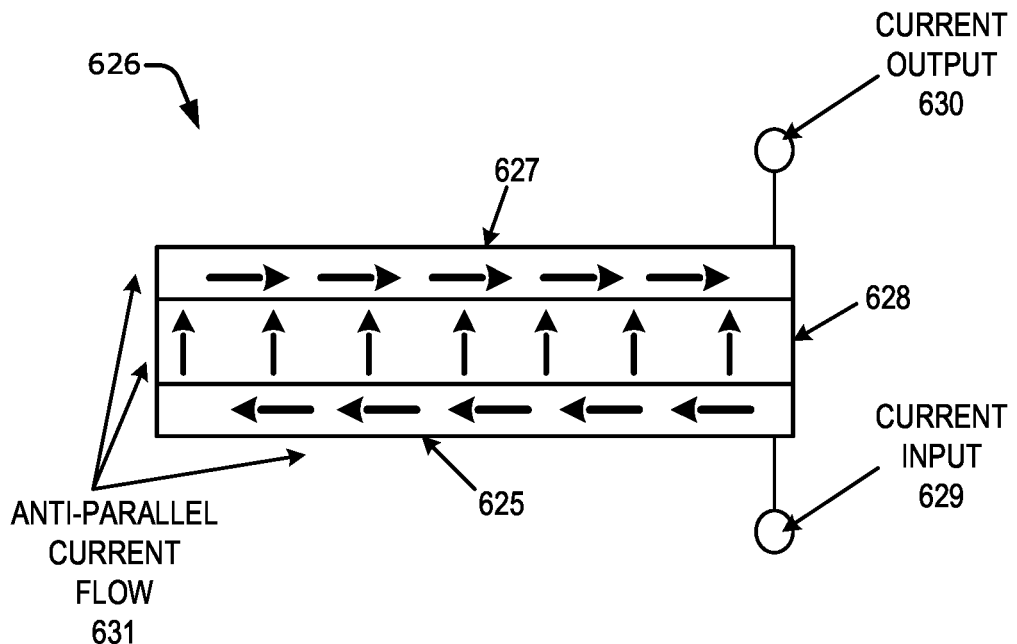
FIG. 6C is a representation of a resonator in accordance with aspects of examples described herein.

FIG. 6C is a representation of the resonator 626 in accordance with aspects of examples described herein. FIG. 6C shows an anti-parallel current flow 631 resulting from the side feeding configuration of the current input 629 and the current output 630 as described above. The side feeding configurations results in a U-shaped current flow as described above, with the current input 629 and the current output 630 at the tips of the U-shape. The current flows along the input busbar 625 in one direction, across the electrode structures 628, and then back through the output busbar 627. The current flow 631 through the output busbar 627 is along a parallel line to the current flow 631 through the input busbar 625. The U-shaped structure leading to the associated anti-parallel current flow 631 contributes to inductances at high frequency that can interact with a resonator such as the resonator 626 to create in band resonance spikes that can degrade performance.

Figure 6D:
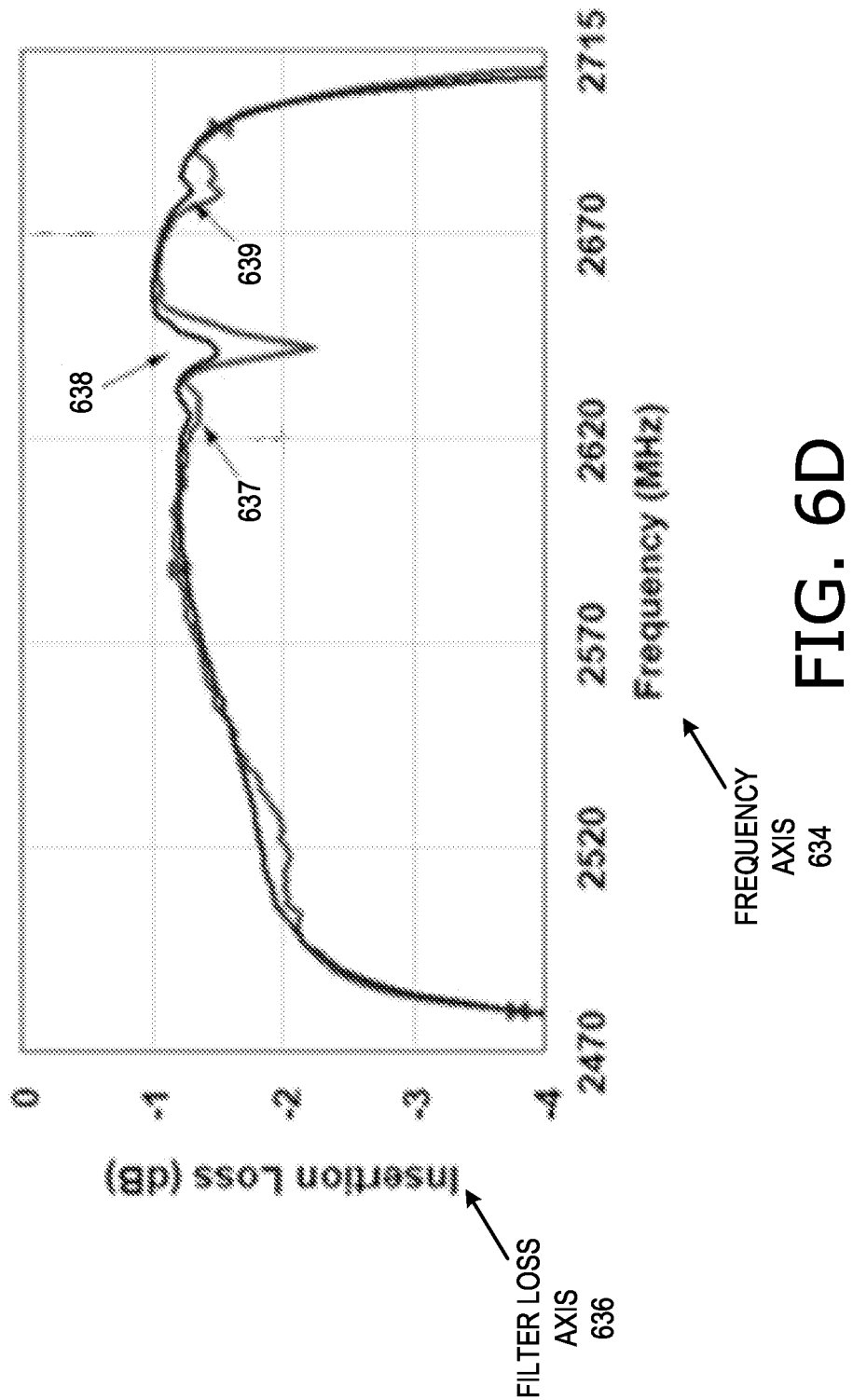
FIG. 6D is a frequency response chart illustrating aspects of examples described herein.

FIG. 6D is a frequency response chart illustrating aspects of examples described herein. The frequency response chart of FIG. 6D has a horizontal frequency axis 634 for a frequency band within a frequency range from approximately 2470 megahertz (MHz) to 2715 MHz. The frequency response chart has a vertical filter loss axis showing an insertion loss in decibels (dB) for a passband filter covering the frequency band. The frequency response chart shows resonance spikes 637, 638, and 639 in two filter response curves of the frequency response chart. As detailed, the resonance spikes 637, 638, and 639 are associated with a resonator interacting with an inductance from a connection pad and the long U-shape under the anti-parallel current flow, generating a resonance spike in the response of resonator 626 that then reduces performance via passband filter ripple in the form of the resonance spikes 637, 638 and 639.

Figure 6E:
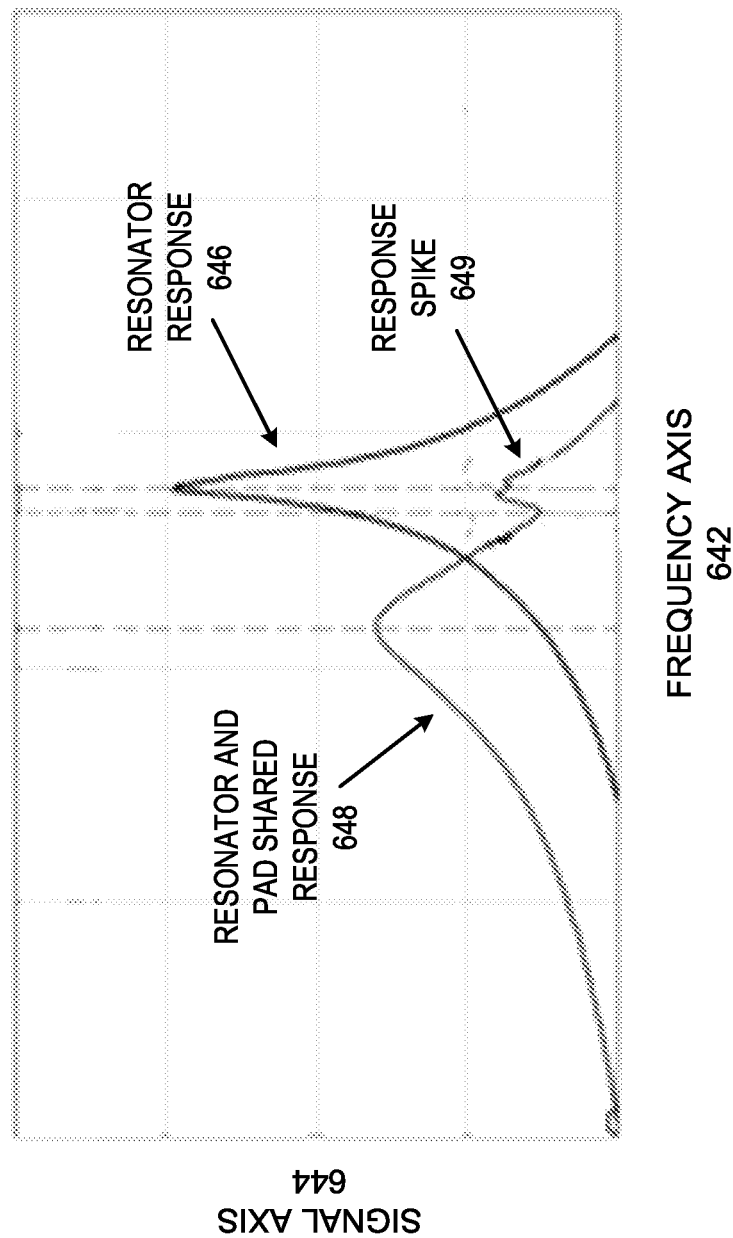
FIG. 6E is a frequency response chart illustrating aspects of examples described herein.

FIG. 6E is a frequency response chart illustrating aspects of examples described herein. FIG. 6E includes frequency axis 642 and signal axis 644. A signal response chart is shown for the resonator 626 by itself as resonator response 646, along with a signal response chart for the resonator 626 combined with surrounding structures (e.g., pad connections) as resonator and pad shared response 648. The resonator response 646 has a spike at a center frequency associated with resonator 626, that when combined with the surrounding electrical structures (e.g., connection pads), leads to response spike 649 that can further result in resonance spikes 637, 638, and 639 in a filter passband (e.g., an associated filter passband for a frequency band filter circuit). Examples described herein mitigate such resonance spikes using a split resonator to modify the impact of the in-band response spike 649 and improve performance of an associated filter passband.

Figure 7A:
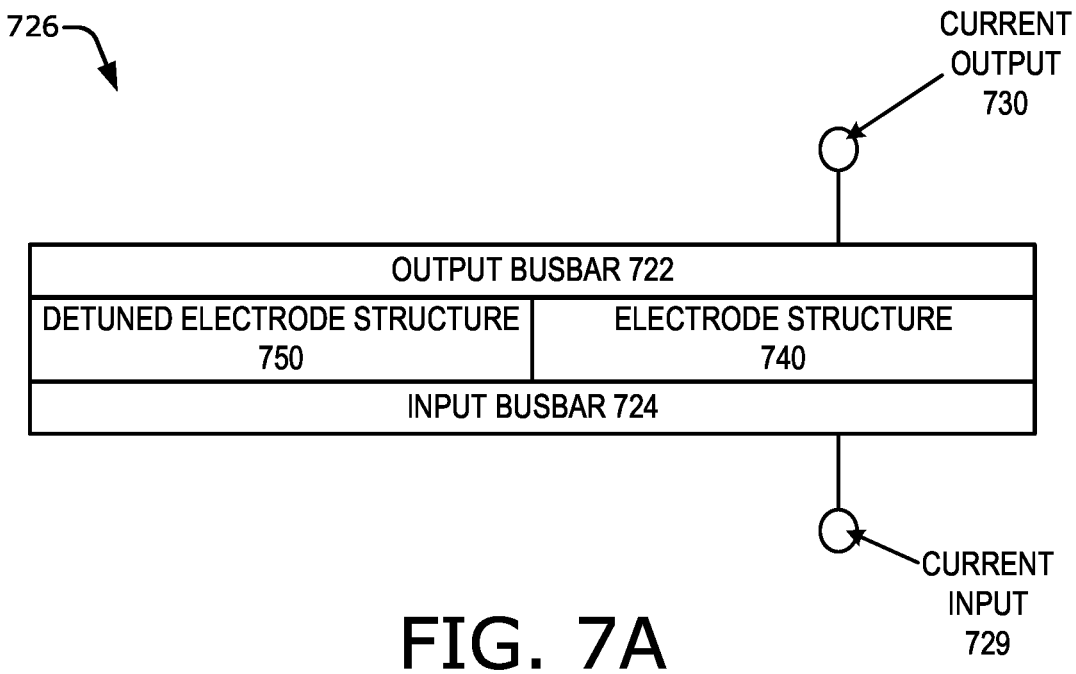
FIG. 7A is a representation of a split resonator in accordance with aspects of examples described herein.
Figure 7B:
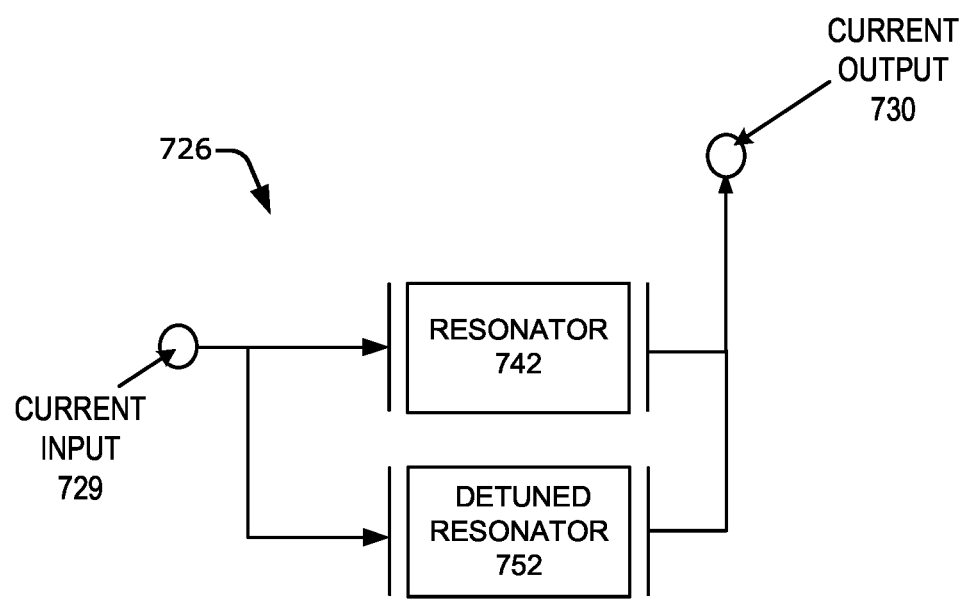
FIG. 7B is a representation of a split resonator in accordance with aspects of examples described herein.

FIG. 7A is a representation of a split resonator 726 in accordance with aspects of examples described herein. Split resonator 726 has a similar structure to resonator 626, but with the electrode structures 628 of resonator 626 replaced with electrode structure 740 and detuned electrode structure 750. Input busbar 724 and output busbar 722 are shared by a resonator 742 (e.g., as shown in FIG. 7B) of the split resonator 726 associated with electrode structure 740, and a detuned resonator 752 (e.g., as shown in FIG. 7B) of the split resonator 726 associated with detuned electrode structure 750. Current input 729 can be the same or similar to current input 629, and current output 730 can be the same or similar to current output 630. While the current input 729 and the current output 730 are shown as single inputs on opposite but corresponding positions in busbar 724 and busbar 722, in various other examples, any number of input and output electrical connections can be used in different implementations to address the resonance spikes for a passband in accordance with examples described herein. In some aspects, as illustrated by FIG. 7A, the split resonator may be understood to correspond to a single resonator with two different resonator portions or sections (e.g., the electrode structure 740 with associated elements, and the detuned electrode structure 750 with associated elements). In some aspects, examples may also be described in terms of the separate functionality of a resonator (e.g., including electrode structure 740) and a detuned resonator (e.g., including detuned electrode structure) which can function as "separate" resonators, as discussed below with respect to FIG. 7B.

FIG. 7B is a representation of a split resonator 726 in accordance with aspects of examples described herein. FIG. 7B shows an electrical schematic representation of the detuned resonator of FIG. 7A. As illustrated, the split resonator 726 can be represented electrically as two resonators, which are depicted in FIG. 7B as the resonator 742 and the detuned resonator 752. The parallel resonators share the current input 729 and the current output 730, as well as the shared input busbar 724 and the shared output busbar 722 as described above in the rough structural representation of FIG. 7A.

As discussed above in FIGS. 5A and 5B, resonators can be used in wireless devices (e.g., as part of a filter such as the filter circuit 500 of FIG. 5A). Resonators in such applications can have structures selected with designed resonance values which are used in the apparatus design (e.g., a resonance value of a resonator can impact passband or stopband characteristics of a filter in conjunction with other resonators or filter elements). Such resonance values can be set by the pitch of filters in a resonator. As described for example, in FIG. 6E, a resonator response (e.g., the resonator response 646) can lead to unwanted response characteristics (e.g., the response spike 649 of the resonator and pad shared response 648). A split resonator such as split resonator 726 can then be used in place of any resonator in a wireless communication apparatus, such as the wireless communication apparatus 600 above. The detuning described herein can be structured as an offset from a designed resonance value (e.g., an adjusted pitch from the finger pitch set for the selected design resonance value) to reduce unwanted ripple or spikes in a response. Such use of a split resonator to address passband ripple and resonance spikes can use the split resonator 726 for a wireless communication apparatus with a frequency band filter circuit having an associated filter passband. The split resonator 726 can be described as comprising the resonator 742 made up of a first section of a shared input busbar 724 (e.g., the portion of input busbar 724 connected to electrode structure 740), a first section of a shared output busbar 722 (e.g., the portion of output busbar 722 connected to electrode structure 740), and the electrode structure 740 between the first section of the shared input busbar 724 and the first section of the shared output busbar 722. The electrode structure configured for a resonance (e.g., with a value selected as part of a filter design, such as the design of ladder filter circuit 500 of FIG. 5A). The split resonator 726 can further be described as comprising a detuned resonator 752 made up of a second section of the shared input busbar 724 (e.g., the portion of input busbar 724 connected to detuned electrode structure 750), a second section of the shared output busbar (e.g., the portion of output busbar 722 connected to the detuned electrode structure 750), and the detuned electrode structure 750 between the second section of the shared input busbar 724 and the second section of the shared output busbar 722. The detuned electrode structure 750 is configured for a detuned resonance different from the resonance of the resonator 742.

In some examples, due to the self-inductances in connection pads (e.g., associated with the current input 729 and the current output 730), the resonance generates a spike as described above. The self-inductances are associated with the curve at the bottom of the U-shape detailed in FIG. 6C showing the current flow 631, where the return current flow (e.g., anti-parallel current flow) in a resonator excites resonance of the acoustic device. By detuning the portion of the problematic resonator (e.g., the resonator 626) furthest away from the pads (e.g., and furthest away from the current input 729 as well as the current output 730), the spike is weakened. The portion of the U furthest away from the pads is can be described as the bottom portion of the U-shape for the anti-parallel current flow. Superposition of the detuning by the self-inductance in the pad and the acoustic resonance by the return current flow results in a local maximum and a local minimum as illustrated by response spike 649 of resonator and pad shared response 648 of FIG. 6E. The response spike 649 then results in a passband ripple shown by the resonance spikes 637, 638, and 639. Such spikes become larger with increased superposition effects from "longer" resonator structures, as discussed above. By detuning a resonator with the split resonator 726 structure, the superposition and the associated local resonance is weakened. Sufficient detuning can result in elimination of ripple in a passband such as the ripple from the resonance spikes 637, 638, and 639 in accordance with examples described herein.

FIGS. 7A and 7B show a split resonator 726 with a single split resulting in two resonators. Additional examples can include a split resonator with multiple-splits, resulting in one or more additional central resonators. In FIG. 7A, such central resonators would be represented by one or more associated electrode structures between detuned electrode structure 750 and electrode structure 740. Three splits would result in two such central resonators and two associated central electrode structures. The electrode structures for the additional central resonators would have the same general structure between the output busbar 722 and the input busbar 724. Electrically, in FIG. 7B, the three splits would result in two additional resonators, bot in parallel with resonator 742 and detuned resonator 752 (e.g., one end of each central resonator would be coupled to current input 729 and the other end of each central resonator would be coupled to the current output 730). In various examples, a split resonator can be configured with any number of splits resulting in any number of resonators, so long as the impact on the passband or stopband meets the performance targets of the associated design.

Figure 7C:
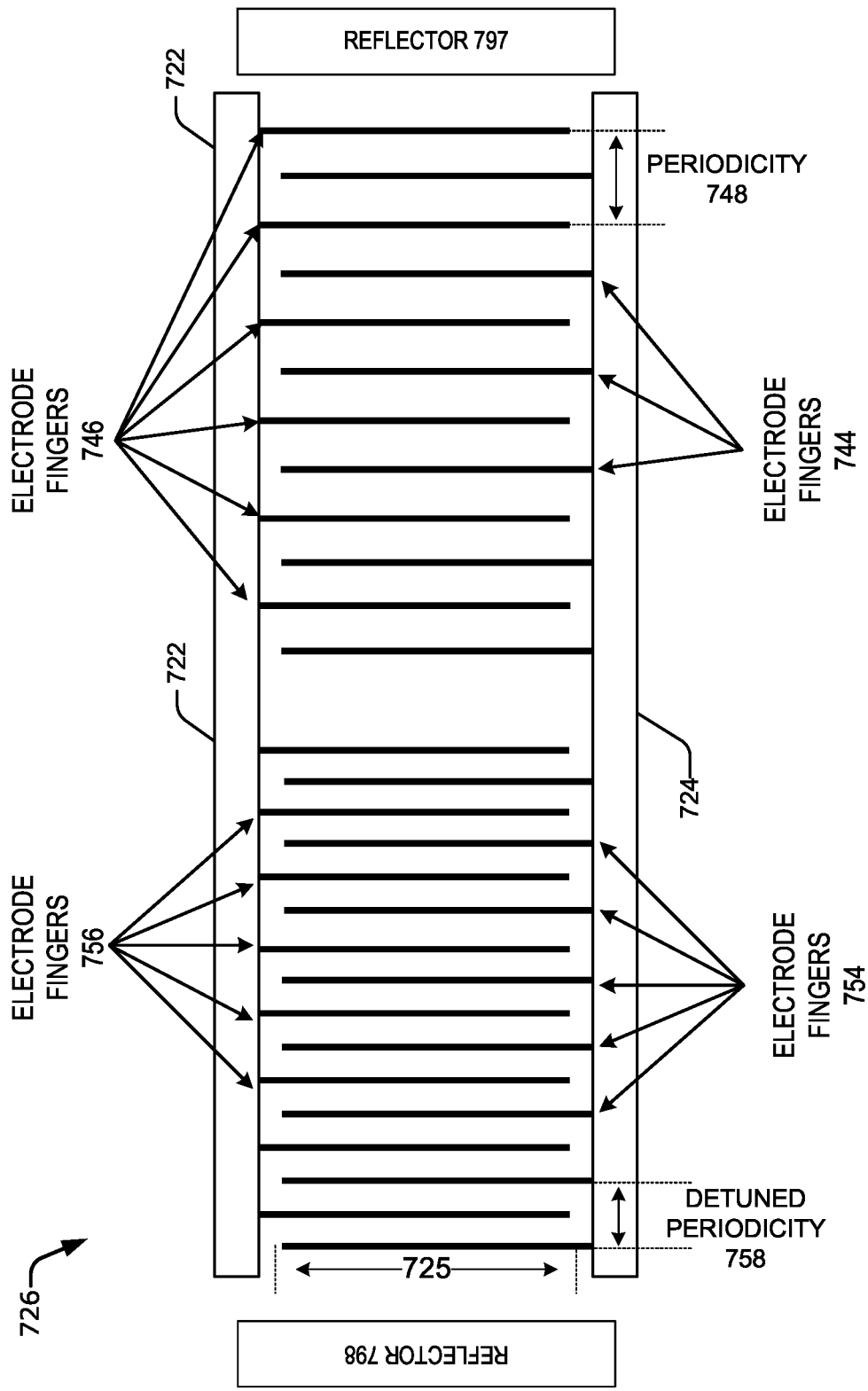
FIG. 7C is a representation of a split resonator in accordance with aspects of examples described herein.

FIG. 7C is a representation of the split resonator 726 in accordance with aspects of examples described herein. The representation of the split resonator 726 is similar to the IDT 205 of FIG. 2A. FIG. 7C is a diagram of a top view of an example of an electrode structure for the split resonator 726 (e.g., an electroacoustic device). As illustrated in FIG. 7C and above, the split resonator 726 is part of an IDT that includes the input busbar 724 and the output busbar 722 (e.g., roughly parallel conductive segments or rails with pads on a shared end that create an anti-parallel current flow during use). The split resonator 726 includes reflectors 797 and 798 on either side of a central region 725, similar to the reflectors described above (e.g., described with respect to FIGS. 2A and 2B). The busbars are electrically connected to pads or terminals as part of a communication path of a communication device as described in FIGS. 5A and 5B. The electrode structure of split resonator 726 includes the electrode structure 740 made up of a comb structure having a plurality of electrode fingers 744 and 746. The electrode structure of the split resonator 726 also includes the detuned electrode structure 750 made up of comb shaped electrode fingers 754 and 756. The electrode fingers of both the electrode structure 740 and the detuned electrode structure 750 are each connected to a corresponding section (e.g., the resonator 742 or the detuned resonator 752) of the input busbar 724 or the output busbar 722. The electrode fingers for each structure extend towards the opposite busbar but do not connect to that opposite busbar. The electrode fingers are interleaved in an interdigitated manner with the corresponding electrode fingers of the same structure (e.g., the electrode structure 740 or the detuned electrode structure 750). For each electrode finger extending from a busbar, the electrode finger is configured so that it extends toward the opposite busbar but leaves a small gap between the ends of the fingers 226 and the opposite busbar.

In the direction along the busbars, there is an overlap region including a central region where a portion of one finger overlaps with a portion of an adjacent finger as illustrated by the central region 725. The central region 725 including the overlap may be referred to as the aperture, track, or active region where electric fields are produced between fingers to cause an acoustic wave to propagate as described above. For split resonator 726, electrode fingers 746 and 744 have a periodicity 748, and electrode fingers 756 and 754 have a detuned periodicity 758. The periodicity of the fingers for both the resonator 742 and the detuned resonator 752 is referred to as an aspect of the pitch of each section. In certain aspects, the pitch (detuned periodicity 758) of the detuned resonator 752 is different than the pitch (e.g., periodicity 748) of the resonator 742. In some examples, the detuned pitch or detuned periodicity 758 can be determined or configured to be within a calculated distance (e.g., in MHz) of the pitch or periodicity 748. In other examples, the detuned periodicity 758 can be determined based on the distance between a resonance for periodicity 748 and an edge of a passband associated with a filter using the split resonator 726. In other examples, other criteria are used to select the resonator pitches. Additional details related to selection of the detuned periodicity 758 are discussed below.

In various examples, different aspects of the electrode finger placement may be used for both periodicity 748 and to select the detuned periodicity 758. The associated pitch may be indicted in various ways. For example, in certain aspects, the pitch may correspond to a magnitude of a distance between fingers in the central region 725, an average of distances between adjacent fingers, and a frequency at which the piezoelectric material vibrates is a self-resonance (also called a "main-resonance") frequency of the electrode structure. For different split resonators and different implementations, any such factor can be modified to select pitch for each section of the split resonator 726 in accordance with the examples described herein.

In various examples, the different parts of the split-resonator can have different transitions. In some examples, as described below with respect to FIG. 7D, two reflectors are positioned as part of the transition. Similarly, in FIG. 7E, a single reflector is positioned as part of the transition. In some examples, the transition (e.g., between electrode fingers 756 and 754 of a detuned portion and electrode fingers 746 and 744 of a resonator portion of split resonator 726) can be structured in different ways. In some examples, a transition area has a smoothly changing IDT pitch, or an IDT periodicity profile in a middle transition area that avoids local resonances at the intersection between the resonator and the detuned resonator portions. In some examples, finger distances in a transition area can be configured as pitch1*(1-eta)/2<distance<pitch2*(1-eta)/2, where pitch1 is an IDT pitch of a first area, distance is a length of a transition area, pitch2 is an IDT pitch in a second area, and eta is a metallization ratio of the pitch. Such finger distances at the transition avoids local resonances while enabling the benefits of the split-resonator structure described above.

Figure 7D:
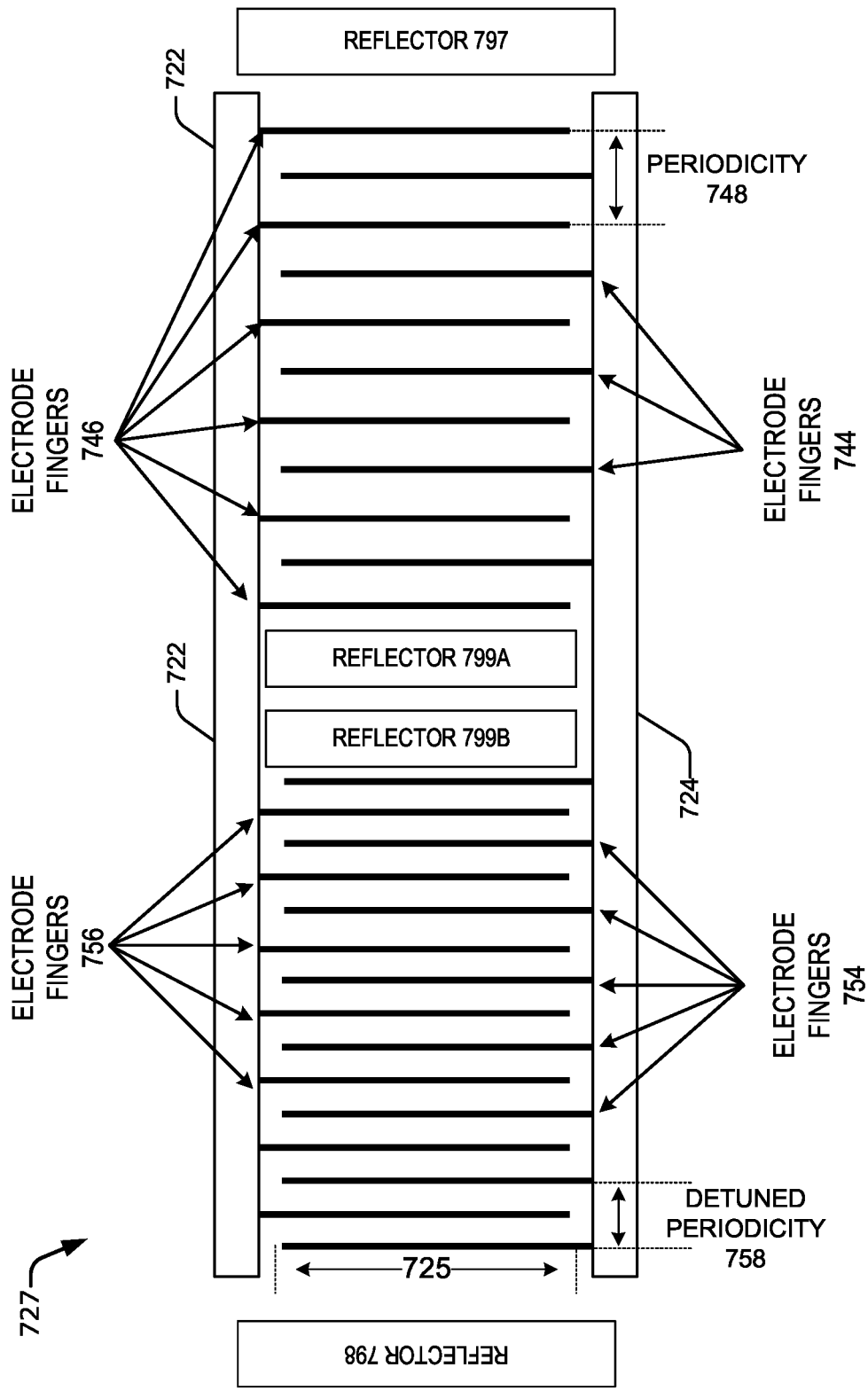
FIG. 7D is a representation of a split resonator with central reflectors in accordance with aspects of examples described herein.

FIG. 7D is a representation of a split resonator 727 with two central reflectors 799A and 799B in accordance with aspects of examples described herein. Split resonator 727 is similar to split resonator 726 of FIG. 7C, with similar reflectors 798 and 797, electrode fingers 744, 746, 754, and 756, and the same shared busbars 722, and 724 as well as the periodicity 748 and the detuned periodicity 758. Split resonator 727 additionally includes the central reflectors 799A and 799B between the two portions of the split resonator. The central reflectors 799A and 799B can be structured similar to the reflectors 228, but positioned in the transition region to allow the two sides of the split resonator to function within a circuit to improve performance, while limiting local resonances due to the transition.

In one example, a first reflector (e.g., reflector 797) is adjacent to a portion (e.g., a not-detuned portion) of an electrode structure and works with a central reflector (e.g., central reflector 799A) to form a resonator section. A second reflector (e.g., reflector 798) is adjacent to a detuned portion of the structure and works with another central reflector (e.g., central reflector 799B) to form a detuned resonator section. In the example of FIG. 7D, two central reflectors are shown, which can be designed to match the resonance of each associated section of the split resonator. In other examples, a single central reflector can be used, as illustrated by FIG. 7E.

FIG. 7E is a representation of a split resonator 728 with a central reflector 799 in accordance with aspects of examples described herein. Split resonator 728 is similar to split resonator 726 of FIG. 7C and split resonator 727 of FIG. 7D, with similar reflectors 798 and 797, electrode fingers 744, 746, 754, and 756, and the same shared busbars 722, and 724 as well as the periodicity 748 and the detuned periodicity 758. Split resonator 728 includes a single central reflector 799 between the two sections of the split resonator. The central reflector 799 can be structured similar to the reflectors 228, but positioned in the transition region between a detuned section and resonator section (e.g., a not-detuned section or a tuned section) of split resonator 728 to allow the two sides to function within a circuit to improve performance, while limiting local resonances due to the transition.

In addition to the implementations of split resonator 727 and split resonator 728 with one or more central reflectors, in other examples other structures can be used to implement the split resonator. In some examples, no central reflector is used, but a transition area is used as described above. In some examples, the transition area has a smoothly changing pitch profile over the transition area. In some such examples, the pitch in the transition area can be designed to compensate the resonance detuning by the self-inductance in a return-current path (e.g., as illustrated in FIG. 6C). In some such examples, the self-inductance at each finger pair is taken into account as part of the design. Similarly, as described above, some examples can include multiple splits in a split resonator, resulting in one or more central electrode structures. In some such examples, each split of the multiple splits can either have one or more reflectors, or a transition area with a pitch structured in each of the multiple transition areas to limit resonances from the transition areas. In some examples, the central electrode structure(s) may have reflectors at either end. In some such examples, a central reflector can have a reflector between the central electrode structure and the adjacent electrode structures. These central reflectors adjacent to a central electrode structure are in addition to the outer electrode structures at the outside edge of the electrode structure 740 and the detuned electrode structure 750. In other examples, the central electrode structure(s) can be used with no central reflector(s).

FIGS. 7C and 7D both show electrode structures with the periodicity 748 and detuned electrode structures with the detuned periodicity 758. In a split resonator with one or more central electrode structures, the central electrode structures can have electrode fingers with a periodicity different from each other and from the periodicity of the outer structures (e.g., the structures of the resonator and detuned resonator at the outer edge of the split resonator). In other examples, a shared periodicity can be used, with central reflectors. In other examples, any such structure can be used to achieve the design and performance targets of a device.

A split resonator such as the split resonator 726 described in FIG. 7C or the split resonator 727 of FIG. 7D can then be used in place of any resonator in a wireless communication apparatus as described above, such as the wireless communication apparatus 600 above. Similar to the description above for FIG. 7B, such use of a split resonator to address passband ripple and resonance spikes can use the split resonator 726 as above for a wireless communication apparatus with a frequency band filter circuit having an associated filter passband and a split resonator 726. The split resonator 726 can be described as comprising a shared input busbar 724, a shared output busbar 722 parallel to the shared input busbar 724, a resonator 742, and a resonator 752. The resonator can be described as comprising an input comb shaped electrode structure with a plurality of electrode fingers 744 coupled to the shared input busbar 724 and extending perpendicularly from the shared input busbar 724 toward the shared output busbar 722. The resonator 742 further comprises an output comb shaped electrode structure with a plurality of electrode fingers 746 coupled to the shared output busbar 722 and extending perpendicularly from the shared output busbar 722 toward the shared input busbar 724. The input comb shaped electrode structure and the output comb shaped electrode structure are arranged with electrode fingers positioned in an interdigitated manner to create a periodicity 748 associated with a resonance. The detuned resonator 752 is positioned separately from the resonator 742 along the shared input busbar 724 and the shared output busbar 722. The detuned resonator 742 comprises a detuned input comb shaped electrode structure with a plurality of electrode fingers 754 coupled to the shared input busbar 724 and extending perpendicularly from the shared input busbar 724 toward the shared output busbar 722. The detuned resonator 752 also includes a detuned output comb shaped electrode structure with a plurality of electrode fingers 756 coupled to the shared output busbar 722 and extending perpendicularly from the shared output busbar 722 toward the shared input busbar 724. The detuned input comb shaped electrode structure and the detuned output comb shaped electrode structure are arranged with electrode fingers positioned in the interdigitated manner to create the detuned periodicity 758 associated with a detuned resonance.

The above descriptions of FIGS. 7C and 7D use right-angles, such that the busbars are described as parallel, and the electrode fingers are described as perpendicular to the busbars. In other examples, other configurations can be used, such that the busbars can be skewed or slanted relative to each other. Similarly, the electrode fingers can be slanted at an angle away from a perpendicular line. In some examples, the busbars may be approximately parallel within a threshold angle, and the electrodes may be approximately perpendicular to the busbars, within a threshold angle. In some examples, a busbar is configured to be a selected number of degrees angled away from a line parallel to the opposite busbar. Similarly, in some examples, electrode fingers can be configured to be a selected number of degrees angled away from a line perpendicular to the attached busbar, while maintaining an interleaved configuration with the electrode fingers of the opposite busbar and not touching the opposite busbar.

Figure 7F:
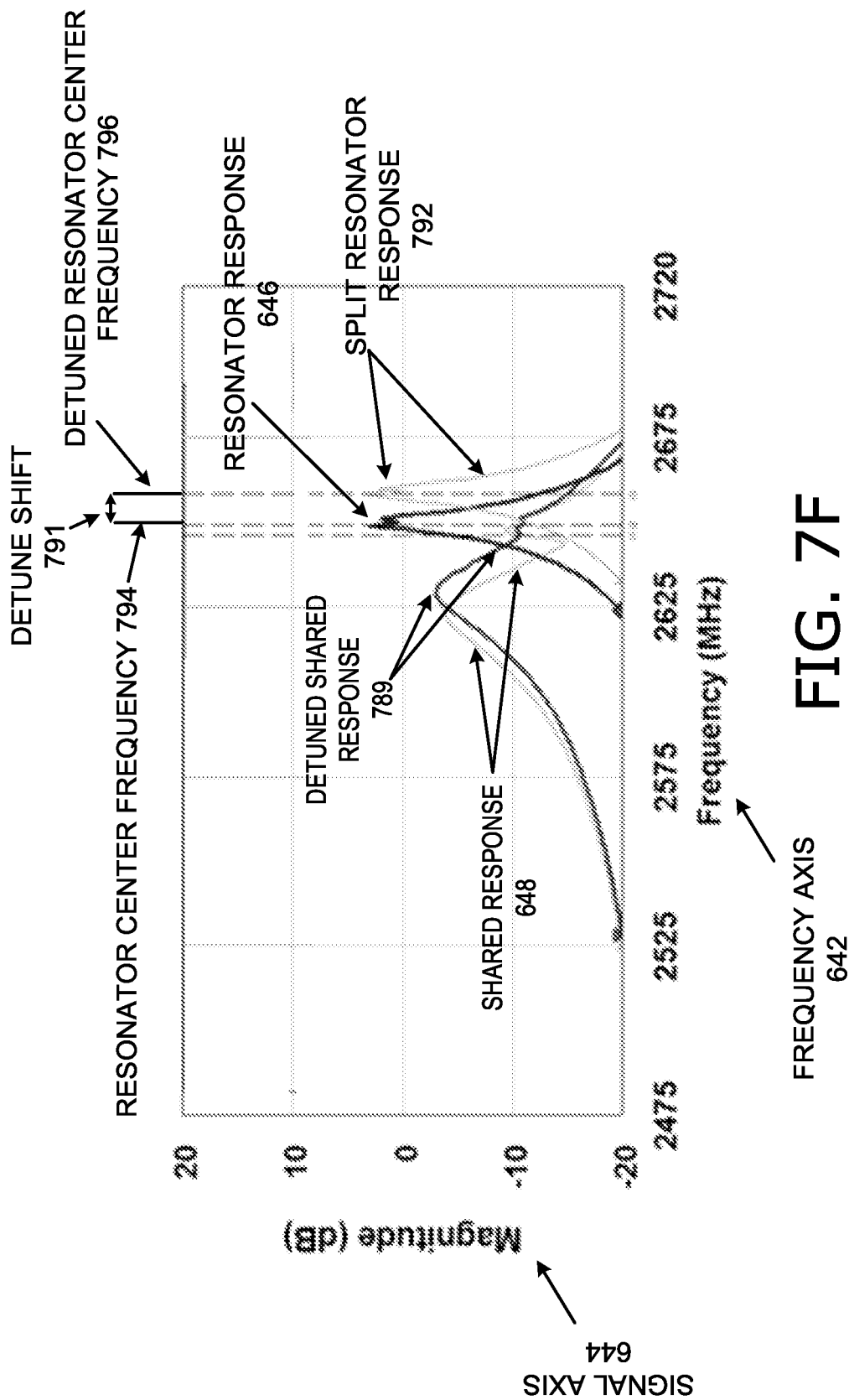
FIG. 7F is a frequency response chart illustrating aspects of examples described herein.

FIG. 7F is a frequency response chart illustrating aspects of examples described herein.

The frequency response chart of FIG. 7F includes a frequency axis 642 and a signal axis 644. The curves within the chart show the impact of detuning on both the resonator 726 and the combination of the resonator 726 and surrounding structures (e.g., inductance from connected pads). The resonator response 646 shown in FIG. 7F the same as the resonator response 646 in FIG. 6E. The resonator response 646 has a resonator center frequency 794 which is also shown in FIG. 7F. As illustrated, a detune shift 791 is present due to the detuning of split resonator 726 resulting in the split resonator response 792 with the detuned resonator center frequency 796. The difference between the center frequency resonance for resonator 626 and the split resonator 726 is the detune shift 791 difference between the resonator center frequency 794 and the detuned resonator center frequency 796.

The improvement from the split resonator response 792 can be seen also in the difference between the shared response 648 (e.g., the same shared response 648 from FIG. 6E) and the detuned shared response 789. As illustrated, the response spike 649 with the associated local minima and maxima are no longer present in the detuned shared response 789.

Figure 7G:
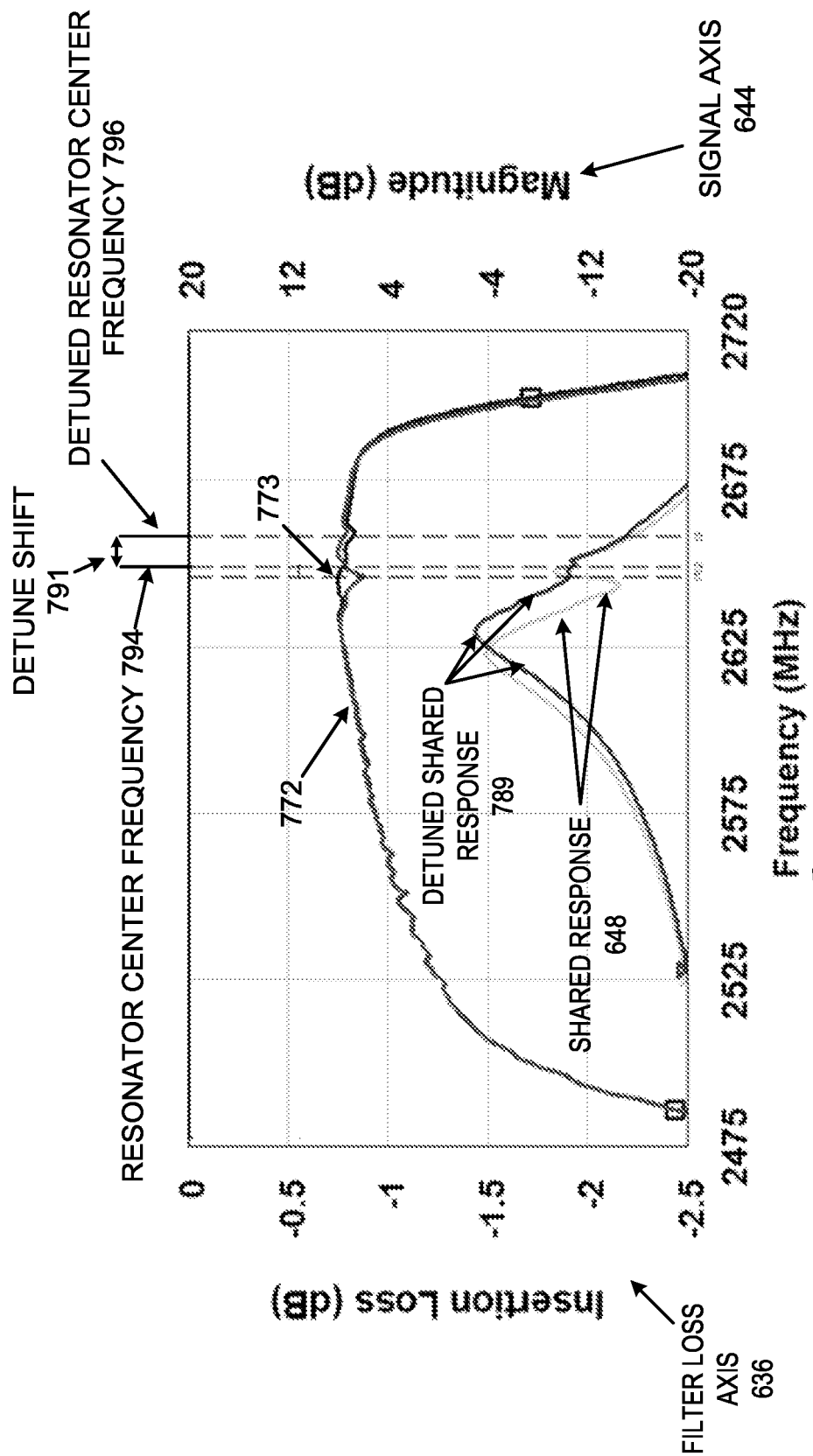
FIG. 7G is a frequency response chart illustrating aspects of examples described herein.

FIG. 7G is a frequency response chart illustrating aspects of examples described herein. FIG. 7G includes frequency axis 642 along with both filter loss axis 636 for passband responses 772, and signal axis 644 for the shared responses 789 and 648 (e.g., which are the same responses shown in FIG. 7F. Just as above in FIG. 7F, FIG. 7G shows the resonator center frequency 794 and the detuned resonator center frequency 796 for the split resonator 726, which are separated by detune shift 791. The value of detune shift 791 is a frequency in MHz, which is set by the difference between resonance frequency associated with the periodicity 748 and the detuned resonance frequency associated with detuned periodicity 758. The resonance frequencies are determined by the periodicities along with any other pitch adjustments (e.g., finger length, finger size, dielectric values, etc.). Also, the same detuned shared response 789 and shared response 648 from FIG. 7F are shown. As described above, the local minima and maximum of the shared response 648 at the response spike 649 create ripple at the resonance spikes 637, 638, and 639. As shown by passband responses 772 and 773, the ripple is reduced by the shift to the detuned shared response 789. The use of the split resonator 726 improves passband performance by reducing the ripple in associated with the resonance spikes 637, 638, and 639, providing improved filter performance and improved communication performance for devices using the split resonator in a filter configured for the detune shift 791 to reduce the passband ripple. As also described above, in different examples, different detune shift 791 values can be used. In some examples, the detune shift 791 is set according to 36.8 MHz/nanohenry (nH) multiplied by an effective inductance of the connected pad(s). Such a selection can have a threshold tolerance, such as a tolerance of plus or minus twenty-five percent. In other examples, other tolerances of values can be used. In some examples, the detune shift 791 is set by shifting a detuned resonator center frequency 796 outside a passband or to a skirt of a passband. In other examples, the detune shift 791 is set by shifting a detuned resonator center frequency 796 of split resonator 726 a threshold distance from resonator center frequency 794. Such a threshold distance can be selected based on a particular filter apparatus to reduce the passband ripple. An example of such a distance can be 20 MHz for passband ripple from a resonator center frequency 794 at 2650 MHz.

In some examples, the detuning can be configured according to:

$$\omega_r - \omega_1 = \omega_r \frac{\omega_a^2 - \omega_r^2}{2\omega_e^2} \quad (1)$$

and can be limited by a threshold difference which sets a largest allowable deviation from the resonator center frequency 794 (e.g., a difference of plus or minus 25 percent, plus or minus 20 percent, or any other appropriate threshold difference between a detuned resonator frequency and a resonator frequency). In the above, $\omega_r$ is a resonance angular frequency and $\omega_a$ is the anti-resonance anglar frequency (e.g. both for the resonator portion of the split resonator). $L_s$ is the inductance of the current paths from a center of the resonator to a center of the detuned resonator. $L_s$ includes the inductance from the current paths in both directions (e.g., through both the input busbar and the output busbar). $C_0$ is the static capacitance of the split resonator.

$$\omega_e^2 = \frac{1}{L_S C_0} \quad (2)$$

And the detuning caused by the pad inductance $L_s$ is:

$$\frac{\omega_1}{\omega_r} = 1 - \frac{\omega_a^2 - \omega_r^2}{2\omega_e^2} \text{ for } \omega_e \gg \omega_r, \omega_a \quad (3)$$

Equation 3 above is the frequency correction to be applied to the detuned resonator (e.g. according to the threshold difference for a design as given by equation 1). Other examples can use other distances or criteria for selecting detuning values.

FIGS. 7C and 7D particularly described SAW versions of a split resonator. Other examples of such a split resonator can be implemented in BAW versions. One such example of a BAW split resonator can have shared first (e.g., top or input) electrodes, and second (e.g., bottom) electrodes, with the resonance area structured between the first and second electrodes. The resonance area includes layers of piezo materials. In such an example, a first portion of the resonance area can include piezo layers of first thicknesses, and a second portion of the resonance area can include piezo layers of second thicknesses. The first piezo layer thicknesses are selected for a first resonance, and the second piezo layer thicknesses are selected for a detuned resonance. The split structure of such a BAW resonator can provide similar benefits to the use of a detuned resonance in a SAW resonator as described above.

Figure 8:
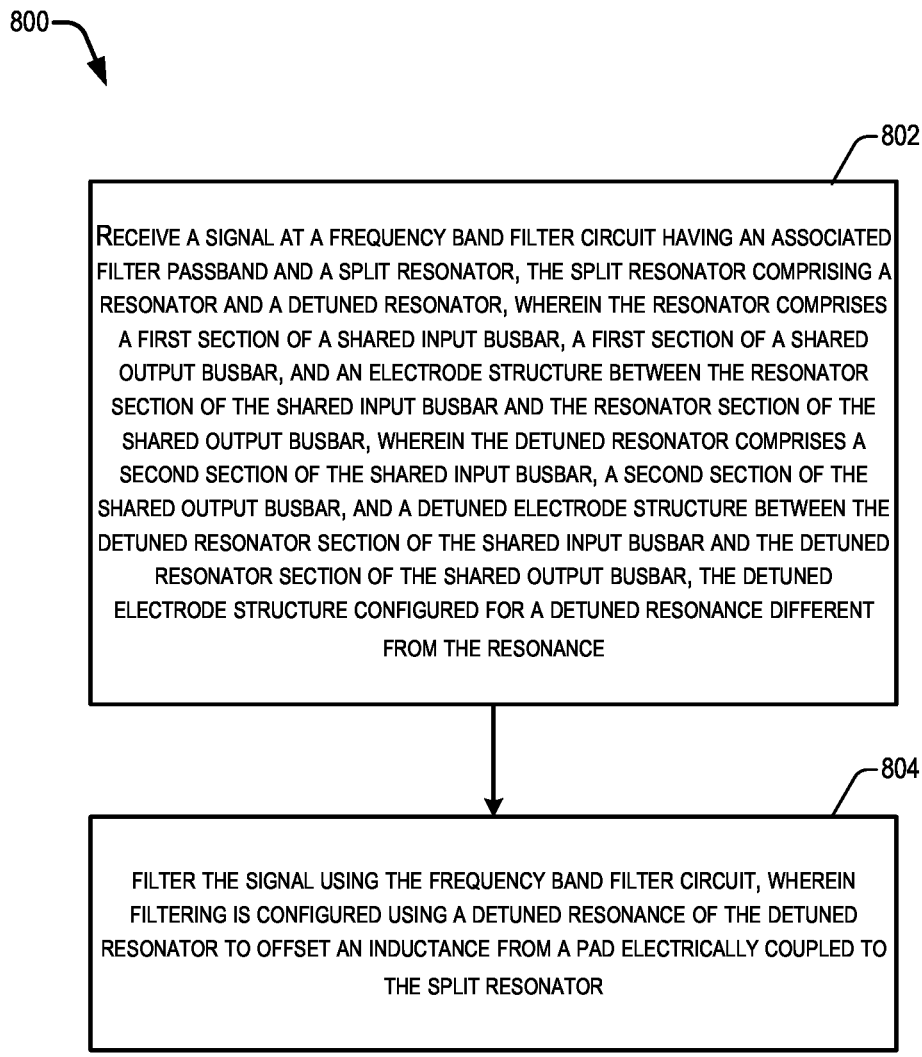
FIG. 8 is a flow chart illustrating an example of a method for filtering a signal in a wireless communication apparatus for a multi-band system in accordance with examples described herein.

FIG. 8 is a flow chart illustrating an example of a method 800 for filtering a signal in a wireless communication apparatus for a multi-band system. The method 800 is described in the form of a set of blocks that specify operations that can be performed. However, operations are not necessarily limited to the order shown in FIG. 8 or described herein, for the operations may be implemented in alternative orders or in fully or partially overlapping manners. Also, more, fewer, and/or different operations may be implemented to perform the method 800, or an alternative approach.

At block 802, the method 800 includes operations to receive a signal at a frequency band filter circuit having an associated filter passband and a split resonator, the split resonator comprising a resonator and a detuned resonator, wherein the resonator comprises a first section of a shared input busbar, a first section of a shared output busbar, and an electrode structure between the first section of the shared input busbar and the first section of the shared output busbar, wherein the detuned resonator comprises a second section of the shared input busbar, a second section of the shared output busbar, and a detuned electrode structure between the second section of the shared input busbar and the second section of the shared output busbar, the detuned electrode structure configured for a detuned resonance different from the resonance At block 804, the method 800 includes operations to filter the signal using the frequency band filter circuit, wherein filtering is configured using a detuned resonance of the detuned resonator to offset an inductance from a pad electrically connected to the split resonator.

Illustrative aspects of the disclosure include:

Aspect 1: A wireless communication apparatus comprising a frequency band filter circuit having a split resonator, the split resonator comprising: a resonator including a first section of a shared input busbar, a first section of a shared output busbar, and an electrode structure between the first section of the shared input busbar and the first section of the shared output busbar, the electrode structure configured for a resonance; and a detuned resonator including a second section of the shared input busbar, a second section of the shared output busbar, and a detuned electrode structure between the second section of the shared input busbar and the second section of the shared output busbar, the detuned electrode structure configured for a detuned resonance different from the resonance.

Aspect 2: The wireless communication apparatus of aspect 1, wherein the detuned resonator is positioned further than the resonator from a current input and a current output for the split resonator.

Aspect 3: The wireless communication apparatus of any of aspects 1 through 2 above, wherein the electrode structure includes first fingers set at a first pitch selected for the resonance; and wherein the detuned electrode structure includes second fingers set at a second pitch selected for the detuned resonance, wherein the first pitch is different from the second pitch Aspect 4: The wireless communication apparatus of any of aspects 1 through 3 above, wherein the split resonator is configured for anti-parallel current flow, with a current through the shared input busbar flowing in an opposite direction from a current through the shared output busbar.

Aspect 5: The wireless communication apparatus of any of aspects 1 through 4 above, further comprising a pad electrically coupled to the split resonator, wherein the detuned resonance is selected to compensate for an inductance from the pad.

Aspect 6: The wireless communication apparatus of any of aspects 1 through 5 above, wherein the detuned resonance is determined as a function of a resonance angular frequency, and anti-resonance angular frequency, and is within a threshold value associated with a largest allowable deviation by the detuned resonance from the resonance.

Aspect 7: The wireless communication apparatus of any of aspects 1 through 6 above, wherein the detuned resonance is within 20 MHz of the resonance.

Aspect 8: The wireless communication apparatus of any of aspects 1 through 7 above, wherein the detuned resonance is within one percent of a center frequency of the apparatus.

Aspect 9: The wireless communication apparatus any of aspects 1 through 8 above, wherein the detuned resonance is within ten percent of a passband width of the associated filter passband.

Aspect 10: The wireless communication apparatus any of aspects 1 through 9 above, wherein the detuned resonance is within ten percent of a stopband width of an associated filter stopband.

Aspect 11: The wireless communication apparatus of aspect of any of aspects 1 through 10 above, further comprising a plurality of resonators in a ladder configuration, wherein the plurality of resonators comprises the split resonator.

Aspect 12: The wireless communication apparatus of aspect 11, wherein the resonator and the detuned resonator are configured as parallel resonators within the ladder configuration.

Aspect 13: The wireless communication apparatus of aspect 11, wherein the plurality of resonators are microacoustic.

Aspect 14: The wireless communication apparatus of aspect 11, wherein the associated filter passband has an upper frequency less than or equal to 6 gigahertz (GHz).

Aspect 15: The wireless communication apparatus of aspect of any of aspects 1 through 14 above, further comprising an output port electrically coupled to the shared output busbar; and an input port electrically coupled to the shared input busbar.

Aspect 16: The wireless communication apparatus of aspect 14, further comprising: a filter circuit including the split resonator; an antenna coupled to the output port via one or more elements of the filter circuit; and processing circuitry coupled to the input port via second one or more elements of the filter circuit.

Aspect 17: The wireless communication apparatus of any of aspects 1 through 16 above, wherein the wireless communication apparatus comprises a mobile communication device including a transceiver circuit, wherein the transceiver circuit includes the frequency band filter circuit.

Aspect 18: The wireless communication apparatus of any of aspects 1 through 17 above, further comprising: a plurality of frequency band filter circuits comprising the frequency band filter circuit for a first band, a frequency band filter circuit for a second band, and a frequency band filter circuit for a third band.

Aspect 19: The wireless communication apparatus of aspect 18, wherein the split resonator further comprises a piezo material, wherein the electrode structure and the detuned electrode structure are positioned on the piezo material.

Aspect 20: The wireless communication apparatus of aspect 17, wherein the frequency band filter circuit further includes a first reflector and a second reflector with the split resonator positioned between the first reflector and the second reflector.

Aspect 21: The wireless communication apparatus of any of aspects 1 through 20 above, wherein the resonator further includes a first reflector positioned at a side of the resonator away from the detuned resonator, and a first central reflector positioned at a side of the resonator adjacent to the detuned resonator; and wherein the detuned resonator further includes a second reflector positioned at a side of the detuned resonator away from the resonator, and a second central reflector positioned adjacent to the first central reflector of the resonator.

Aspect 22: The wireless communication apparatus of any of aspects 1 through 21 above, further comprising one or more additional resonators positioned between the resonator and the detuned resonator, the one or more additional resonators including one or more central portions of the shared input busbar and one or more central portions of the shared output busbar.

Aspect 23: The wireless communication apparatus of aspect 22, further comprising a first reflector positioned at an input end of the resonator, and a second reflector at an end of the detuned resonator; wherein the wireless communication apparatus does not include a reflector positioned between any of the resonator, the detuned resonator, or the one or more additional resonators.

Aspect 24: A wireless communication apparatus comprising: a frequency band filter circuit having an associated filter passband and a split resonator, the split resonator comprising: a shared input busbar; a shared output busbar positioned relative to the shared input busbar; a resonator comprising: an input comb shaped electrode structure with a plurality of electrode fingers coupled to the shared input busbar and extending from the shared input busbar toward the shared output busbar; and an output comb shaped electrode structure with a plurality of electrode fingers coupled to the shared output busbar and extending from the shared output busbar toward the shared input busbar, wherein the input comb shaped electrode structure and the output comb shaped electrode structure are arranged with electrode fingers positioned in an interdigitated manner to create a periodicity associated with a resonance; and a detuned resonator positioned separately from the resonator along the shared input busbar and the shared output busbar, the detuned resonator comprising: a detuned input comb shaped electrode structure with a plurality of electrode fingers coupled to the shared input busbar and extending from the shared input busbar toward the shared output busbar; and a detuned output comb shaped electrode structure with a plurality of electrode fingers coupled to the shared output busbar and extending from the shared output busbar toward the shared input busbar, wherein the detuned input comb shaped electrode structure and the detuned output comb shaped electrode structure are arranged with electrode fingers positioned in an interdigitated manner to create a detuned periodicity associated with a detuned resonance.

Aspect 25: The wireless communication apparatus of aspect 24, further comprising a pad coupled to the frequency band filter circuit, wherein a pitch of the second plurality of electrode fingers coupled to the shared input busbar and the second plurality of electrode fingers coupled to the shared output busbar of the second resonator section is selected to compensate for an inductance of the pad.

Aspect 26: The device of aspect 25, wherein the first periodicity is associated with a first resonance, and wherein the second periodicity is associated with a second resonance offset from the first resonance by a detuning amount.

Aspect 27: The wireless communication apparatus of any of aspects 24 through 26 above, wherein the detuning amount is a frequency values less than 20 megahertz (MHz), such that the first resonance is within 20 MHz of the second resonance.

Aspect 28: The wireless communication apparatus of any of aspects 24 through 27 above, wherein the resonator further comprises one or more central reflectors positioned between the first resonator section and the second resonator section.

Aspect 29 is a method of filtering a signal in a wireless communication apparatus, the method comprising: receiving the signal at a frequency band filter circuit having an associated filter passband and a split resonator, the split resonator comprising a resonator and a detuned resonator, wherein the resonator comprises a first section of a shared input busbar, a first section of a shared output busbar, and an electrode structure between the first section of the shared input busbar and the first section of the shared output busbar, wherein the resonator is configured for a resonance, and wherein the detuned resonator comprises a second section of the shared input busbar, a second section of the shared output busbar, and a detuned electrode structure between the second section of the shared input busbar and the second section of the shared output busbar, the detuned electrode structure configured for a detuned resonance different from the resonance; and filtering the signal using the frequency band filter circuit, wherein filtering is configured using a detuned resonance of the detuned resonator to offset an inductance from a pad electrically coupled to the split resonator.

Aspect 30: The method of aspect 28, wherein the signal is received from an antenna via a multiplexer coupled to the filter circuit.

Aspect 31: A wireless communication apparatus comprising a frequency band filter circuit having an associated filter passband and a split resonator, the split resonator comprising: means for generating a resonance using a shared input busbar and a shared output busbar; and means for generating a detuned resonance different from the resonance using the shared input busbar and the shared output busbar.

Aspect 32A: The wireless communication apparatus of aspect 31, wherein the means for generating the detuned resonance is positioned further than the means for producing the resonance from a current input and a current output for the split resonator.

Aspect 32B: The wireless communication apparatus of any of aspects 31 or 32A through 31 above, wherein the split resonator is configured for anti-parallel current flow, with a current through the shared input busbar flowing in an opposite direction from a current through the shared output busbar.

Aspect 33: The wireless communication apparatus of any of aspects above, further comprising a pad electrically coupled to the split resonator, wherein the detuned resonance is selected to compensate for an inductance from the pad.

Aspect 34: The wireless communication apparatus of aspect 33, wherein the detuned resonance is within a threshold value of the resonance.

Aspect 35: The wireless communication apparatus of aspect 33, wherein the detuned resonance is within 20 MHz of the resonance.

Aspect 36: The wireless communication apparatus of aspect 33, wherein the detuned resonance is within one percent of a center frequency of the apparatus.

Aspect 37: The wireless communication apparatus of aspect 33, wherein the detuned resonance is within ten percent of a passband width of the associated filter passband.

Aspect 38: The wireless communication apparatus of aspect 33, wherein the detuned resonance is within ten percent of a stopband width of an associated filter stopband.

Aspect 39: The wireless communication apparatus of any of aspects 30 through 38 above, further comprising means for coupling the associated filter passband to a shared antenna for multiband communications.

Aspect 40: The wireless communication apparatus of any of aspects 30 through 39 above further comprising means for transmitting and receiving communications via the associated filter passband.

Aspect 41: The wireless communication apparatus of any of aspects 30 through 40 above, further comprising a plurality of resonators in a ladder configuration, wherein the plurality of resonators comprises the split resonator.

Aspect 42: The wireless communication apparatus of any of aspects 30 through 41 above, wherein the associated filter passband has an upper frequency less than or equal to 6 gigahertz (GHz).

Aspect 43: The wireless communication apparatus of any of aspects 30 through 42 above, further comprising an output port electrically coupled to the shared output busbar; and an input port electrically coupled to the shared input busbar.

Aspect 44: The wireless communication apparatus of aspect 43, further comprising an antenna coupled to the output port.

Aspect 45: The wireless communication apparatus of aspect 43, further comprising processing circuitry coupled to the input port.

Aspect 46: The wireless communication apparatus of any of aspects 30 through 45 above, wherein the wireless communication apparatus comprises a mobile communication device including a transceiver circuit, wherein the transceiver circuit includes the frequency band filter circuit.

Aspect 47: The wireless communication apparatus of any of aspects 30 through 46 above, further comprising: a plurality of frequency band filter circuits comprising the frequency band filter circuit for a first band, a frequency band filter circuit for a second band, and a frequency band filter circuit for a third band.

Aspect 48: The wireless communication apparatus of aspect 47, wherein the plurality of frequency band filter circuits comprise micro-electroacoustic filters implemented as surface acoustic wave devices.

Aspect 49: The wireless communication apparatus of aspect 47, wherein the plurality of frequency band filter circuits comprise micro-electroacoustic filters implemented as bulk acoustic wave devices.

Aspect 50: The wireless communication apparatus of aspect 47, wherein the plurality of frequency band filter circuits comprise micro-electroacoustic filters implemented with MEMS devices.

Aspect 51: The wireless communication apparatus of any of aspects 30 through 50 above, wherein the frequency band filter circuit further includes a first reflector and a second reflector with the split resonator positioned between the first reflector and the second reflector.

Aspect 52: The wireless communication apparatus of aspect 51, further comprising a central reflector positioned between the resonator and the detuned resonator.

Aspect 53: The wireless communication apparatus of any of aspects 30 through 52 above, further comprising one or more additional resonators positioned between the resonator and the detuned resonator, the one or more additional resonators including one or more central portions of the input busbar and one or more central portions of the output busbar.

Aspect 54: The wireless communication apparatus of aspect 53 further comprising a first reflector positioned at an input end of the resonator, and a second reflector at an end of the detuned resonators; wherein the wireless communication apparatus does not include a reflector positioned between any of the resonator, the detuned resonator, or the one or more additional resonators.

Aspect 55: A method, the method including operations according to any of aspects 1 to 54.

Aspect 56: A non-transitory computer readable medium comprising instructions that, when executed by a wireless communication device, causes the wireless communication device to perform operations according to any of aspects 1 to 54.

Aspect 57: An apparatus comprising means for performing operations according to any of aspects 1 to 54.

FIG. 9 is a functional block diagram of at least a portion of an example of a simplified wireless transceiver circuit 900 in which the wireless communication apparatus 600 of FIG. 6A with a split resonator such as split resonator 726 may be employed. The transceiver circuit 900 is configured to receive signals/information for transmission (shown as I and Q values) which is provided to one or more base band filters 912. The filtered output is provided to one or more mixers 914. The output from the one or more mixers 914 is provided to a driver amplifier 916 whose output is provided to a power amplifier 918 to produce an amplified signal for transmission. The amplified signal is output to the antenna 922 through one or more filters 920 (e.g., duplexers if used as a frequency division duplex transceiver or other filters). The one or more filters 920 may include any filter circuit described herein, which can include one or more split resonators in accordance with the details of the above description. The antenna 922 may be used for both wirelessly transmitting and receiving data. The transceiver circuit 900 includes a receive path through the one or more filters 920 to be provided to a low noise amplifier (LNA) 924 and a further filter 926 and then down-converted from the receive frequency to a baseband frequency through one or more mixer circuits 928 before the signal is further processed (e.g., provided to an analog digital converter and then demodulated or otherwise processed in the digital domain). There may be separate filters for the receive circuit (e.g., may have a separate antenna or have separate receive filters) that may be implemented using any filter circuit described herein.

FIG. 10 is a diagram of an environment 1000 that includes an electronic device 1002 that includes a wireless transceiver 1096 such as the transceiver circuit 900 of FIG. 9. In the environment 1000, the electronic device 1002 communicates with a base station 1004 through a wireless link 1006. As shown, the electronic device 1002 is depicted as a smart phone. However, the electronic device 1002 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1004 communicates with the electronic device 1002 via the wireless link 1006, which may be implemented as any suitable type of wireless link. Although depicted as a base station tower of a cellular radio network, the base station 1004 may represent or be implemented as another device, such as a satellite, terrestrial broadcast tower, access point, peer to peer device, mesh network node, fiber optic line, another electronic device generally as described above, and so forth. Hence, the electronic device 1002 may communicate with the base station 1004 or another device via a wired connection, a wireless connection, or a combination thereof. The wireless link 1006 can include a downlink of data or control information communicated from the base station 1004 to the electronic device 1002 and an uplink of other data or control information communicated from the electronic device 1002 to the base station 1004. The wireless link 1006 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1002 includes a processor 1080 and a memory 1082. The memory 1082 may be or form a portion of a computer readable storage medium. The processor 1080 may include any type of processor, such as an application processor or a multi-core processor, that is configured to execute processor-executable instructions (e.g., code) stored by the memory 1082. The memory 1082 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1082 is implemented to store instructions 1084, data 1086, and other information of the electronic device 1002, and thus when configured as or part of a computer readable storage medium, the memory 1082 does not include transitory propagating signals or carrier waves.

The electronic device 1002 may also include input/output ports 1090. The I/O ports 1090 enable data exchanges or interaction with other devices, networks, or users or between components of the device.

The electronic device 1002 may further include a signal processor (SP) 1092 (e.g., such as a digital signal processor (DSP)). The signal processor 1092 may function similar to the processor and may be capable executing instructions and/or processing information in conjunction with the memory 1082.

For communication purposes, the electronic device 1002 also includes a modem 1094, a wireless transceiver 1096, and an antenna (not shown). The wireless transceiver 1096 provides connectivity to respective networks and other electronic devices connected therewith using radio-frequency (RF) wireless signals and may include the transceiver circuit 900 of FIG. 9. The wireless transceiver 1096 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application-specific integrated circuit (ASIC), or processor. As part of such operations, method 800 described above can further include blocks to perform any additional functions described for detuning or configuration of a split resonator in accordance with examples described herein.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A wireless communication apparatus comprising:
   a frequency band filter circuit having a split resonator, the split resonator comprising:
   a resonator including a first section of a shared input busbar, a first section of a shared output busbar, and an electrode structure between the first section of the shared input busbar and the first section of the shared output busbar, the electrode structure configured for a resonance; and
   a detuned resonator including a second section of the shared input busbar, a second section of the shared output busbar, and a detuned electrode structure between the second section of the shared input busbar and the second section of the shared output busbar, the detuned electrode structure configured for a detuned resonance different from the resonance, wherein the split resonator is configured for anti-parallel current flow, with a current through the shared input busbar flowing in an opposite direction from a current through the shared output busbar.

2. The wireless communication apparatus of claim 1, wherein the detuned resonator is positioned further than the resonator from a current input and a current output for the split resonator.

3. The wireless communication apparatus of claim 1, wherein the electrode structure includes first fingers set at a first pitch selected for the resonance; and
   wherein the detuned electrode structure includes second fingers set at a second pitch selected for the detuned resonance, wherein the first pitch is different from the second pitch.

4. The wireless communication apparatus of claim 1, further comprising a pad electrically coupled to the split resonator, wherein the detuned resonance is selected to compensate for an inductance from the pad.

5. The wireless communication apparatus of claim 1, wherein the detuned resonance is determined as a function of a resonance angular frequency, an anti-resonance angular frequency, and is within a threshold value associated with a largest allowable deviation by the detuned resonance from the resonance.

6. The wireless communication apparatus of claim 1, wherein the detuned resonance is within 20 MHz of the resonance.

7. The wireless communication apparatus of claim 1, wherein the detuned resonance is within one percent of a center frequency of the frequency band filter circuit.

8. The wireless communication apparatus of claim 1, wherein the detuned resonance is within ten percent of a passband width of a filter passband of the frequency band filter circuit.

9. The wireless communication apparatus of claim 1, wherein the detuned resonance is within ten percent of a stopband width of a filter stopband of the frequency band filter circuit.

10. The wireless communication apparatus of claim 1, wherein the frequency band filter circuit comprises a plurality of resonators in a ladder configuration, wherein the plurality of resonators comprises the split resonator.

11. The wireless communication apparatus of claim 10, wherein the split resonator is configured as a parallel resonator within the ladder configuration.

12. The wireless communication apparatus of claim 10, wherein the plurality of resonators are micro-acoustic.

13. The wireless communication apparatus of claim 10, wherein a filter passband of the frequency band filter circuit has an upper frequency less than or equal to 6 gigahertz (GHz).

14. The wireless communication apparatus of claim 1, further comprising an output port electrically coupled to the shared output busbar; and
   an input port electrically coupled to the shared input busbar.

15. The wireless communication apparatus of claim 14, further comprising:
   a filter circuit including the split resonator;
   an antenna coupled to the output port via first one or more elements of the filter circuit; and
   processing circuitry coupled to the input port via second one or more elements of the filter circuit.

16. The wireless communication apparatus of claim 1, wherein the wireless communication apparatus comprises a mobile communication device including a transceiver circuit, wherein the transceiver circuit includes the frequency band filter circuit.

17. The wireless communication apparatus of claim 1, further comprising:
   a plurality of frequency band filter circuits comprising the frequency band filter circuit for a first band, a frequency band filter circuit for a second band, and a frequency band filter circuit for a third band.

18. The wireless communication apparatus of claim 17, wherein the split resonator further comprises a piezo material, wherein the electrode structure and the detuned electrode structure are positioned on the piezo material.

19. The wireless communication apparatus of claim 1, wherein the frequency band filter circuit further includes a first reflector and a second reflector with the split resonator positioned between the first reflector and the second reflector.

20. The wireless communication apparatus of claim 1, wherein the resonator further includes a first reflector positioned at a side of the resonator away from the detuned resonator, and a first central reflector positioned at a side of the resonator adjacent to the detuned resonator; and wherein the detuned resonator further includes a second reflector positioned at a side of the detuned resonator away from the resonator, and a second central reflector positioned adjacent to the first central reflector of the resonator.

21. The wireless communication apparatus of claim 1, further comprising one or more additional resonators positioned between the resonator and the detuned resonator, the one or more additional resonators including one or more central portions of the shared input busbar and one or more central portions of the shared output busbar.

22. The wireless communication apparatus of claim 21 further comprising a first reflector positioned at an input end of the resonator, and a second reflector at an end of the detuned resonator;

wherein the wireless communication apparatus does not include a reflector positioned between any of the resonator, the detuned resonator, or the one or more additional resonators.

23. A wireless communication apparatus comprising:
a frequency band filter circuit having a resonator, the resonator comprising:
  a piezoelectric material;
  a shared input busbar;
  a shared output busbar;
  a first resonator section including:
    a first input comb shaped electrode structure with a first plurality of electrode fingers coupled to the shared input busbar and extending from the shared input busbar toward the shared output busbar; and
    a first output comb shaped electrode structure with a first plurality of electrode fingers coupled to the shared output busbar and extending from the shared output busbar toward the shared input busbar, wherein the first input comb shaped electrode structure and the first output comb shaped electrode structure are arranged with electrode fingers positioned in an interdigitated manner and having a first periodicity; and
  a second resonator section positioned separately from the first resonator section along the shared input busbar and the shared output busbar, the second resonator section comprising:
    a second input comb shaped electrode structure with a second plurality of electrode fingers coupled to the shared input busbar and extending from the shared input busbar toward the shared output busbar; and
    a second output comb shaped electrode structure with a second plurality of electrode fingers coupled to the shared output busbar and extending from the shared output busbar toward the shared input busbar, the second input comb shaped electrode structure and the second output comb shaped electrode structure arranged with electrode fingers positioned in an interdigitated manner having a second periodicity different from the first periodicity, wherein the second resonator section is positioned further than the first resonator section from a current input and a current output of the resonator, wherein the first periodicity is associated with a first resonance, and wherein the second periodicity is associated with a second resonance offset from the first resonance by a detuning amount, wherein the detuning amount is a frequency values less than 20 megahertz (MHz), such that the first resonance is within 20 MHz of the second resonance.

24. The wireless communication apparatus of claim 23, further comprising a pad coupled to the frequency band filter circuit, wherein the second periodicity is selected to compensate for an inductance of the pad.

25. The wireless communication apparatus of claim 23, wherein the resonator further comprises one or more central reflectors positioned between the first resonator section and the second resonator section.

26. A method of filtering a signal in a wireless communication apparatus, the method comprising:
receiving the signal at a frequency band filter circuit having an associated filter passband and a split resonator, the split resonator comprising a resonator and a detuned resonator, wherein the resonator comprises a first section of a shared input busbar, a first section of a shared output busbar, and an electrode structure between the first section of the shared input busbar and the first section of the shared output busbar, wherein the resonator is configured for a resonance, and wherein the detuned resonator comprises a second section of the shared input busbar, a second section of the shared output busbar, and a detuned electrode structure between the second section of the shared input busbar and the second section of the shared output busbar, the detuned electrode structure configured for a detuned resonance different from the resonance; and
filtering the signal using the frequency band filter circuit, wherein filtering is configured using a detuned resonance of the detuned resonator to offset an inductance from a pad electrically coupled to the split resonator.

27. The method of claim 26, wherein the signal is received from an antenna via a multiplexer coupled to the frequency band filter circuit.

28. The wireless communication apparatus of claim 23, wherein a current through the shared input busbar is configured to flow in an opposite direction from a current through the shared output busbar.

29. A wireless communication apparatus comprising:
a frequency band filter circuit having a split resonator, the split resonator comprising:
  a resonator including a first section of a shared input busbar, a first section of a shared output busbar, and an electrode structure between the first section of the shared input busbar and the first section of the shared output busbar, the electrode structure configured for a resonance;
  a detuned resonator including a second section of the shared input busbar, a second section of the shared output busbar, and a detuned electrode structure between the second section of the shared input busbar and the second section of the shared output busbar, the detuned electrode structure configured for a detuned resonance different from the resonance; and
  a pad electrically coupled to the split resonator, wherein the detuned resonance is selected to compensate for an inductance from the pad.

* * * * *